(12) United States Patent
Miyairi et al.

(10) Patent No.: US 9,472,776 B2
(45) Date of Patent: Oct. 18, 2016

(54) METHOD FOR MANUFACTURING SEALED STRUCTURE INCLUDING WELDED GLASS FRITS

(71) Applicants: Hidekazu Miyairi, Kanagawa (JP); Akihisa Shimomura, Kanagawa (JP)

(72) Inventors: Hidekazu Miyairi, Kanagawa (JP); Akihisa Shimomura, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 322 days.

(21) Appl. No.: 13/645,091

(22) Filed: Oct. 4, 2012

(65) Prior Publication Data

US 2013/0095582 A1 Apr. 18, 2013

(30) Foreign Application Priority Data

Oct. 14, 2011 (JP) .................................. 2011-227026

(51) Int. Cl.
*H01L 21/00* (2006.01)
*H01L 51/52* (2006.01)
*H01L 51/56* (2006.01)

(52) U.S. Cl.
CPC ........... *H01L 51/5246* (2013.01); *H01L 51/56* (2013.01)

(58) Field of Classification Search
CPC ............... H01L 51/5237; H01L 51/56; H01L 51/5246; H01L 27/322; H01L 51/448; C03C 27/06; C03C 8/24; C03C 23/0025
USPC ........................................................ 438/26
See application file for complete search history.

(56) References Cited

U.S. PATENT DOCUMENTS

| 6,113,450 | A  | 9/2000  | Narayanan et al. |
| 6,596,613 | B1 | 7/2003  | Kusumoto et al.  |
| 6,646,284 | B2 | 11/2003 | Yamazaki et al.  |
| 6,803,246 | B2 | 10/2004 | Yamazaki et al.  |
| 6,860,780 | B2 | 3/2005  | Miyashita et al. |
| 6,903,800 | B2 | 6/2005  | Onishi et al.    |
| 6,984,159 | B1 | 1/2006  | Kado et al.      |
| 6,998,776 | B2 | 2/2006  | Aitken et al.    |
| 7,121,642 | B2 | 10/2006 | Stoessel et al.  |
| 7,371,143 | B2 | 5/2008  | Becken et al.    |
| 7,407,423 | B2 | 8/2008  | Aitken et al.    |
| 7,431,628 | B2 | 10/2008 | Park et al.      |
| 7,564,185 | B2 | 7/2009  | Song et al.      |
| 7,602,121 | B2 | 10/2009 | Aitken et al.    |
| 7,701,136 | B2 | 4/2010  | Kwak             |

(Continued)

FOREIGN PATENT DOCUMENTS

| JP | 5-208852  | 8/1993  |
| JP | 11-329717 | 11/1999 |

(Continued)

*Primary Examiner* — Duy T Nguyen
(74) *Attorney, Agent, or Firm* — Husch Blackwell LLP

(57) ABSTRACT

A method for manufacturing a sealed structure in which few cracks are generated is provided. Scan with the laser beam is performed so that there is no difference in an irradiation period between the middle portion and the perimeter portion of the glass layer and so that the scanning direction is substantially parallel to the direction in which solidification of the glass layer after melting proceeds. More specifically, in a region where the beam spot is overlapped with the glass layer, scan is performed with a laser beam having a beam spot shape whose width in a scanning direction is substantially uniform. Further, as a laser beam with which the glass layer is irradiated, a laser beam (a linear laser beam) having a linear beam spot shape with a major axis and a minor axis which is orthogonal to the major axis.

10 Claims, 18 Drawing Sheets

(56) References Cited

U.S. PATENT DOCUMENTS

| | | |
|---|---|---|
| 7,780,493 B2 | 8/2010 | Choi et al. |
| 7,837,530 B2 | 11/2010 | Park |
| 7,862,396 B2 | 1/2011 | Lee |
| 7,868,540 B2 | 1/2011 | Kim |
| 7,871,949 B2 | 1/2011 | Lee et al. |
| 7,944,143 B2 | 5/2011 | Choi et al. |
| 8,063,560 B2 | 11/2011 | Aitken et al. |
| 8,125,146 B2 | 2/2012 | Park |
| 8,142,251 B2 | 3/2012 | Lee et al. |
| 8,164,257 B2 | 4/2012 | Choi et al. |
| 8,226,448 B2 | 7/2012 | Voronov et al. |
| 8,247,730 B2 * | 8/2012 | Liu et al. .................. 219/121.6 |
| 2003/0042486 A1 * | 3/2003 | Sano et al. ...................... 257/49 |
| 2004/0195222 A1 | 10/2004 | Tanaka et al. |
| 2004/0207314 A1 | 10/2004 | Aitken et al. |
| 2006/0084348 A1 | 4/2006 | Becken et al. |
| 2007/0170854 A1 | 7/2007 | Kwak |
| 2007/0200835 A1 | 8/2007 | Choo et al. |
| 2008/0182062 A1 * | 7/2008 | Becken et al. .................. 428/68 |
| 2009/0117716 A1 | 5/2009 | Shimomura et al. |
| 2010/0078646 A1 | 4/2010 | Sumita et al. |
| 2010/0096984 A1 | 4/2010 | Kim |
| 2011/0201887 A1 * | 8/2011 | Greenblatt et al. ........... 600/130 |
| 2013/0101754 A1 | 4/2013 | Shimomura et al. |

FOREIGN PATENT DOCUMENTS

| | | |
|---|---|---|
| JP | 2003-297558 | 10/2003 |
| JP | 2008-517446 | 5/2008 |
| JP | 2011-54477 | 3/2011 |
| JP | 2011-65895 | 3/2011 |
| JP | 2011-70797 | 4/2011 |
| WO | WO 2006/045067 A1 | 4/2006 |

* cited by examiner

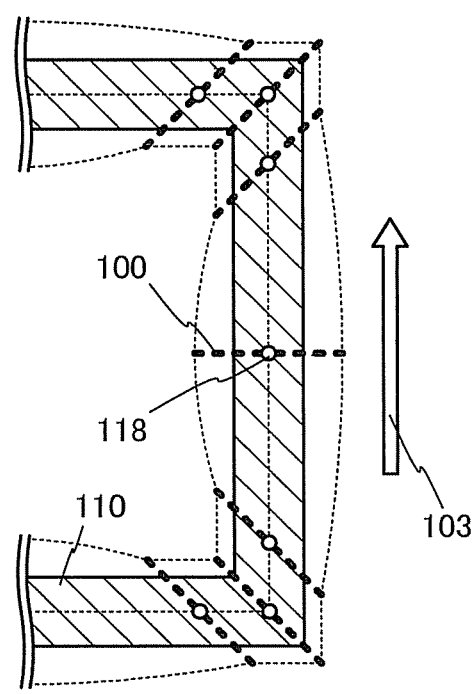

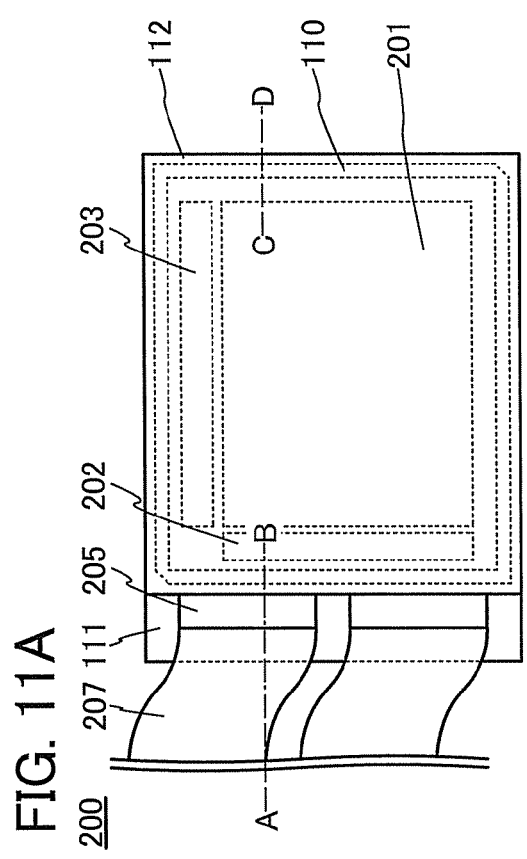
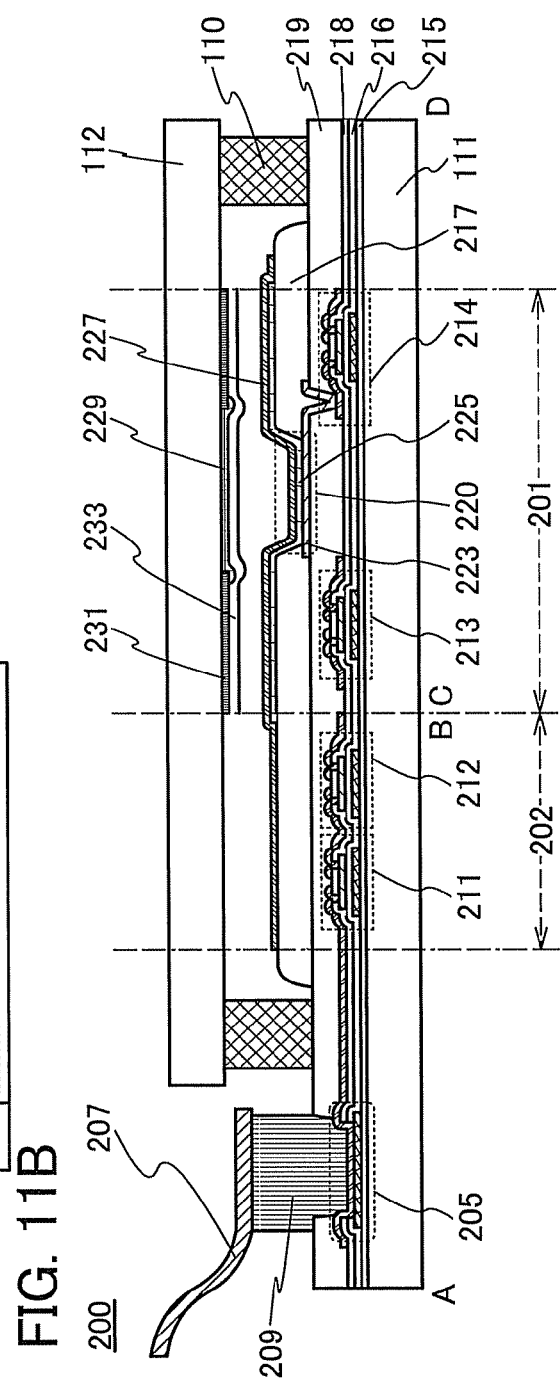
FIG. 11A
FIG. 11B

METHOD FOR MANUFACTURING SEALED STRUCTURE INCLUDING WELDED GLASS FRITS

BACKGROUND OF THE INVENTION

1. Field of the Invention

The present invention relates to a sealed structure including two substrates and a method for manufacturing the sealed structure. The present application claims priority under 35 USC §119 of Japanese application serial number 2011-227026 filed Oct. 14, 2011 in Japan.

2. Description of the Related Art

A technique in which a highly airtight sealed structure is formed in such a manner that two substrates are bonded to each other by a glass layer including low-melting glass is known. In a technique disclosed in Patent Document 1, a paste containing a binder and glass frit (denoted by a "frit material" in the document) including low-melting glass is applied to a glass substrate along an edge of the glass substrate, the binder is removed and the glass frit is melted to form a glass layer (denoted by a "frit glass" in the document) by baking of the paste, the glass layer is irradiated with a laser beam with the substrate overlapping with a counter substrate, and the glass layer is melted so that the substrate and the counter substrate are bonded to each other by the glass frit; thus, a highly airtight sealed structure is formed.

Since such a glass layer has a high gas barrier property, a space sealed with the glass frit can be kept away from the external atmosphere. A method for sealing with such a glass layer is used for a device including an element, such as an organic EL (electroluminescence) element, whose performance is rapidly decreased once the element is exposed to air (including moisture or oxygen).

As examples of the device including the organic EL element, a lighting device with the use of the organic EL element as a light source, an image display device in which a thin film transistor and an organic EL element are combined, and the like can be given. Since the organic EL element can be formed into a film and a large-area organic EL element can be easily formed, a lighting device including a planar light source can be provided using the organic EL element. In addition, an image display device using an organic EL element needs no backlight which is necessary for liquid crystal display devices and the like; therefore, thin, lightweight, high contrast, and low power consumption display devices can be obtained.

REFERENCE

Patent Document

[Patent Document 1] Japanese Published Patent Application No. 2011-65895

SUMMARY OF THE INVENTION

Here, in a conventional method, as the laser beam used for heating and melting the glass layer, a laser beam (hereinafter, also referred to as a circular laser beam) whose beam spot has a substantially circular shape and a spot shape having intensity distributions having substantially circular symmetry has been used. However, in the conventional method for manufacturing the sealed structure using the laser beam, a crack is generated by internal stress in the glass layer after solidification, so that the sealing is broken.

The present invention is made in view of the foregoing technical background. Therefore, one object of an embodiment of the present invention is to provide a method for manufacturing a sealed structure in which few cracks are generated.

Thus, the present invention first focuses on a generation mechanism of internal stress in a glass layer in the case where a circular laser beam is used.

FIG. 17A is a schematic diagram illustrating a beam spot shape of a circular laser beam and intensity distributions thereof. A circular laser beam 10 has intensity distributions having substantially circular symmetry, and for example, an intensity distribution in a section X1-X2 corresponding to the diameter in the horizontal direction of this figure and an intensity distribution in a section Y1-Y2 corresponding to the diameter in the vertical direction of this figure are substantially the same. In FIG. 17A, the intensity is lower at portions closer to the periphery; however, the intensity can have an ideal flat-top shape.

FIG. 17B is a schematic diagram illustrating scan with the circular laser beam 10 along a glass layer 11. The beam spot of the circular laser beam 10 has a substantially circular shape; therefore, as illustrated in FIG. 17B, there is a difference in an irradiation period between a middle portion and a perimeter portion of the glass layer 11. Even in the case where the circular laser beam 10 has intensity distributions having the ideal flat-top shape, there is a difference in a melted state between the middle portion and the perimeter portion of the glass layer 11 while the glass layer 11 is irradiated with a laser beam. As a result, the middle portion and the perimeter portion of the glass layer which has been cooled and solidified have different internal deformations; therefore, large internal stress is generated in the solidified glass layer.

Further, when the glass layer 11 is cooled and solidified, in the middle portion, solidification proceeds in the direction of scan with a laser beam. On the other hand, in the perimeter portion, solidification proceeds in the direction from the perimeter portion to the middle portion as shown by a dashed-line arrow in FIG. 17B. Therefore, in a region closer to the middle portion of the glass layer 11, larger internal stress remains.

Thus, in the heating method using the circular laser beam, large internal stress is generated in a glass layer. By such a large internal stress, a crack is generated in the glass layer, so that the sealing is broken.

Therefore, the present invention focuses on the beam spot shape of the laser beam used in the present invention and a method for scanning with the laser beam, which solves the problem. Scan with the laser beam is performed so that there is no difference in the irradiation period between the middle portion and the perimeter portion of the glass layer and so that the scanning direction is substantially parallel to the direction in which solidification of the glass layer after melting proceeds. More specifically, in a region where the beam spot is overlapped with the glass layer, scan is performed with a laser beam having a beam spot shape whose width in a scanning direction is substantially uniform.

Typically, a laser beam having a rectangular (an oblong or a square) or elliptical beam spot shape can be used in the present invention. Scan may be performed so that two opposite sides of the rectangular beam spot constantly cross both ends of a pattern of the glass layer.

Specifically, a method for manufacturing a sealed structure in accordance with an embodiment of the present invention includes steps of placing a second substrate facing a first substrate, which is in contact with a glass layer including welded glass frits provided over the first substrate, scanning and irradiating the glass layer with a laser beam, and welding the glass layer to the second substrate. In addition, the width of a beam spot in a direction in which scan with the laser beam is performed, which is overlapped with the glass layer is substantially uniform.

Scan is thus performed with a laser beam along the glass layer, whereby the glass layer can be uniformly heated and melted without a difference in the laser beam irradiation period between the middle portion and the perimeter portion of the glass layer.

Further, when the glass layer melted by laser beam irradiation is cooled and solidified, the glass layer is solidified uniformly in one direction, so that stress does not concentrate in the middle portion, and the residual stress inside the glass layer, which generates a crack, can be reduced.

In a method for manufacturing the sealed structure, a laser beam whose beam spot shape has a major axis and a minor axis orthogonal to the major axis is preferably used.

As the above laser beam, use of a laser beam (hereinafter, also referred to as a linear laser beam) having a linear beam spot shape with a major axis and a minor axis orthogonal to the major axis is especially preferred. For example, with the use of a circular laser beam as the above laser beam, the spot diameter needs to be sufficiently larger than the width of the glass layer to be formed in order to prevent a difference in the irradiation period between the middle portion and the perimeter portion in the glass layer. In this case the area of a region that does not overlap with the glass layer and not contribute to heating of the glass layer is extremely large, and energy is wasted accordingly. A larger beam spot area requires higher output in order to achieve the same energy density. Here, with the use of the linear laser beam described above, the area of a region that does not contribute to heating of the glass layer can be reduced, so that the glass layer can be efficiently heated. Moreover, the total beam spot area can be reduced, so that the glass layer can be efficiently heated with lower output than when a circular laser beam is used.

Further, in a method for manufacturing a sealed structure in accordance with another embodiment of the present invention, a glass layer is provided to form a closed curve, and the scan with a laser beam is performed so that an angle formed between the minor axis and a tangent of the closed curve is greater than or equal to 0° and less than or equal to 60°.

When scan with the linear laser beam is performed along the glass layer forming a closed curve to fabricate a sealed structure as described above, the area of a region that is irradiated with the laser beam twice (overlap region) in an irradiation starting region can be extremely small. Accordingly, few cracks are generated and a highly reliable sealed structure can be fabricated.

In the case where scan is performed while the minor axis of the linear laser beam is tilted to the scanning direction thereof, an angle formed between the minor axis and the scanning direction is preferably greater than or equal to 0° and less than or equal to 60°. When a region having a uniform width is irradiated, the necessary length of the major axis direction of the beam spot is proportional to $1/\cos(\theta)$, where $\theta$ represents the angle formed between the minor axis and the scanning direction. Therefore, when this angle exceeds 60°, the necessary length of the major axis direction of the linear laser beam increases suddenly, and accordingly the necessary beam spot area enlarges suddenly. When this angle is less than or equal to 60°, the beam spot area can be small.

In a method for manufacturing a sealed structure in accordance with another embodiment of the present invention, a glass layer is provided to form a closed curve having four sides in which two pairs of two opposite sides are parallel. Further, scan with a laser beam is performed so that an angle formed between the minor axis and each of the sides of the glass layer is greater than or equal to 0° and less than or equal to 60° and so that the minor axis is turned 90° at a corner portion connected to two sides of the closed curve which are not opposite to each other.

In such a method, the laser irradiation step can be completed by one-time scan along the glass layer forming the closed curve; thus, process simplification can be achieved.

Further, a sealed structure sealed with a glass layer with corner portions having the same shapes can be fabricated. By having the same shapes, the corner portions do not differ in residual stress caused by internal deformation, which leads to a highly reliable sealed structure. In addition, both the outer edge and the inner edge of each corner portion can be shaped like an arc. With such corner portions having a curvature, an internal stress in the glass layer can be diminished, so that generation of a crack can be made more difficult. In this case, the curvature radius is preferably large.

In a method for manufacturing a sealed structure in accordance with another embodiment of the present invention, a glass layer is provided to form a closed curve having four sides in which two pairs of two opposite sides are parallel. Further, scan with a laser beam is performed so that an angle formed between the minor axis and each of the sides of the glass layer is greater than or equal to 0° and less than or equal to 60° and so that the minor axis is turned 90° in a region between two corner portions connected to both end points of one side of the closed curve.

In such a method, with corner portions having the same shapes, scan is performed linearly at the corner portions, whereby uniform irradiation can be performed without generating a difference in the laser beam irradiation period between the inner portion and the perimeter portion; thus, a sealed structure which has few cracks can be fabricated.

In a method for manufacturing a sealed structure in accordance with another embodiment of the present invention, a glass layer is provided to form a closed curve having four sides in which two pairs of two opposite sides are parallel. Moreover, scan with a laser beam is performed so that an angle formed between the minor axis and each of the sides of the glass layer is 45°.

When scan is performed with the minor axis tilted 45° to the scanning direction of the linear laser beam as described above, scan with the linear laser beam can be performed along the glass layer without turning the linear laser beam even in the case where the scanning direction is turned 90° at a corner portion of the substrate or the like.

When the angle formed between the minor axis direction and the scanning direction is set to 45°, this angle is constantly kept 45° over the four sides of the glass layer, especially in the case where a right angle is formed between two sides of the glass layer which are not opposite to each other. Hence, even when conditions for the irradiation with the laser beam are common to the two sides that are not opposite to each other, the melted state of the glass layer can be equalized and the welded state of the glass layer can be uniform; thus, a highly reliable sealed structure can be formed.

Note that in this specification and the like, the expression a substantially uniform width is not limited to a completely uniform width and a width is substantially uniform as long as the width of the shortest portion is 90% or more of that of the longest portion.

Note that the term closed curve in this specification and the like means a continuous curve having no end points. The term curve here includes the concept of straight line or line segment in a broad sense. Therefore, a component which includes a plurality of line segments each having an end point overlapping with any of the other end points, such as a periphery of a quadrangle, is also one mode of the closed curve. Further, a circle, an ellipse, a shape in which a plurality of curves having different curvatures is continuously connected, a shape including a straight linear portion and a curve portion, and the like are also modes of the closed curve.

In this specification and the like, the term direction means not only a given direction but also a direction obtained by turning the given direction 180 degrees, that is, a direction opposite to the given direction. Further, a direction is referred to as an orientation in some cases. Furthermore, the term parallel in this specification and the like means not only the state in which directions are exactly parallel to each other but also the state in which an angle formed between directions that are parallel to each other is within ±10°. The term orthogonal in this specification and the like means not only the state in which directions exactly orthogonal to each other but also the state in which an angle formed between directions that are orthogonal to each other is within ±10°. The term perpendicular in this specification and the like means not only the state in which directions are exactly perpendicular to each other but also the state in which an angle formed between directions that are perpendicular to each other is within ±10°.

Further, the term angle in this specification and the like means not only an exact angle but also an angle that is deviates by an angle within ±10°. For example, the term right angle means not only an exact right angle but also an angle that is deviates from an exact right angle by an angle within ±10°.

The term an EL layer in this specification and the like means a layer provided between a pair of electrodes of a light-emitting element, and specifically means at least a layer containing a light-emitting organic compound (also referred to as a light-emitting layer), or a stack including the light-emitting layer.

The term a light-emitting device in this specification means an image display device, and a light source (including a lighting device). In addition, the light-emitting device includes any of the following modules in its category: a module in which a connector such as an FPC (flexible printed circuit), a TAB (tape automated bonding) tape, or a TCP (tape carrier package) is attached to a light-emitting device; a module having a TAB tape or a TCP provided with a printed wiring board at the end thereof; and a module having an IC (integrated circuit) directly mounted over a substrate over which a light-emitting element is formed by a COG (chip on glass) method.

In accordance with the present invention, a method for manufacturing a sealed structure by which generation of a crack can be made difficult can be provided.

BRIEF DESCRIPTION OF THE DRAWINGS

In the accompanying drawings.

FIG. 7 illustrates a method for manufacturing a sealed structure in accordance with one embodiment of the present invention;

FIGS. 11A and 11B illustrate a display device in accordance with one embodiment of the present invention;

DETAILED DESCRIPTION OF THE INVENTION

Figure 1A:
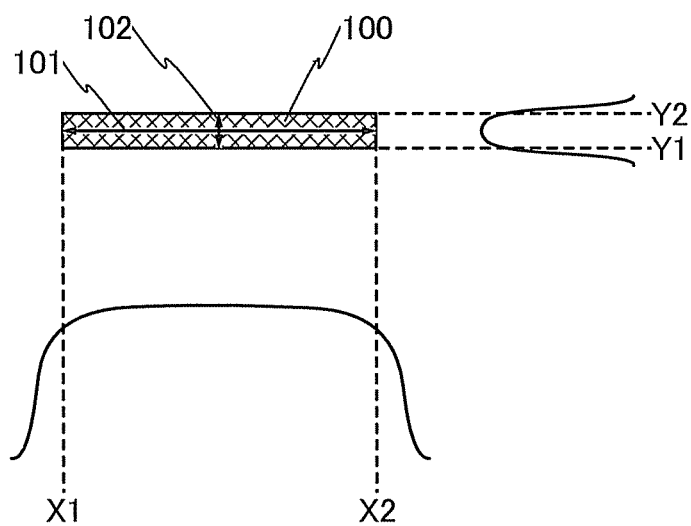
FIGS. 1A to 1F each illustrate a linear laser beam in accordance with one embodiment of the present invention.

Embodiments of the present invention will be described in detail with reference to the accompanying drawings. Note that the invention is not limited to the following description, and it will be easily understood by those skilled in the art that various changes and modifications can be made without departing from the spirit and scope of the invention. Therefore, the invention should not be construed as being limited to the description in the following embodiments. Note also that in the structures of one embodiment of the present invention described below, the same reference numerals in different drawings represent components that are identical or have similar functions, the description of which is not repeated.

Note that in each drawing of this specification, the size, the thickness, or the region of each component is exaggerated for clarity in some cases. Therefore, embodiments of the present invention are not limited to such scales.

Embodiment 1

In this embodiment, a method for manufacturing a sealed structure in accordance with one embodiment of the present invention are described with reference to FIGS. 1A to 1F, FIG. 2, FIGS. 3A and 3B, FIGS. 4A to 4F, FIGS. 5A and 5B, FIGS. 6A to 6C, FIG. 7, FIGS. 8A to 8D, and FIGS. 9A and 9B.

In the method for manufacturing a sealed structure in accordance with one embodiment of the present invention, scan with a laser beam is performed so that there can be no difference in the laser beam irradiation period between the middle portion and the perimeter portion of the glass layer and so that the glass layer after melting is solidified in substantially parallel directions. Specifically, in a region where the beam spot is overlapped with the glass layer, scan with a laser beam is performed so that the beam spot shape has a substantially uniform width in a direction parallel to the scanning direction.

Therefore the beam spot shape may be a shape in which two pairs of two opposite sides intersecting with the scanning direction are substantially parallel to each other, such as a quadrilateral such as a square, an oblong, or a parallelogram, in a region of the beam spot which overlaps with the glass layer. Alternatively, a circular laser beam can be used as long as a spot diameter of the circular laser beam is sufficiently larger than the width of the glass layer.

Scan with the laser beam is performed along the glass layer like this, whereby the difference between the period in which the middle portion of the glass layer is irradiated with the laser beam and the period in which the perimeter portion of the glass layer is irradiated with the laser beam does not occur, and the glass layer can be heated and melted uniformly.

<Heating Method Using Laser Beam Having Rectangular Beam Spot>

Figure 18A:
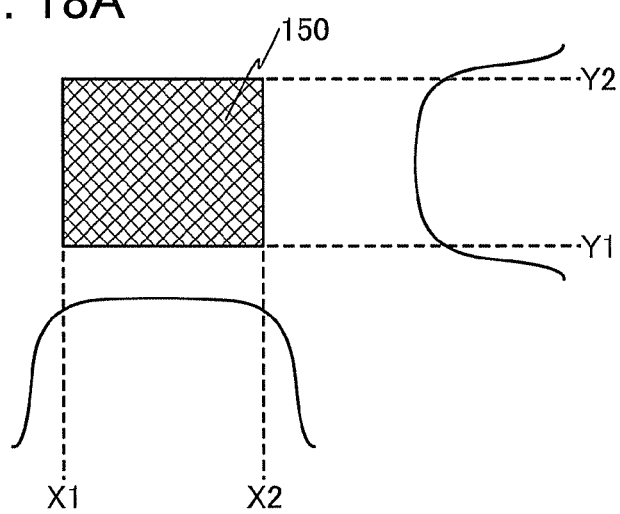
FIGS. 18A to 18C illustrate a laser beam in accordance with one embodiment of the present invention.

FIG. 18A schematically illustrates the beam spot shape of a laser beam 150 having a rectangular beam spot, which can be used for the manufacturing method of a sealed structure in accordance with one embodiment of the present invention, and illustrates the intensity distributions thereof.

Among the intensity distributions in the directions along sides (X1-X2 and Y1-Y2) of the laser beam 150, the intensity distribution in the direction perpendicular to the scanning direction is preferably uniform as much as possible. For example, the intensity distribution in the direction perpendicular to the scanning direction preferably has a flat-top shape. Further, the intensity distribution in the direction parallel to the scanning direction is also preferably uniform, but may have an intensity distribution in which the intensity varies along the direction parallel to the scanning direction like a Gaussian distribution, for example.

Figure 18B:
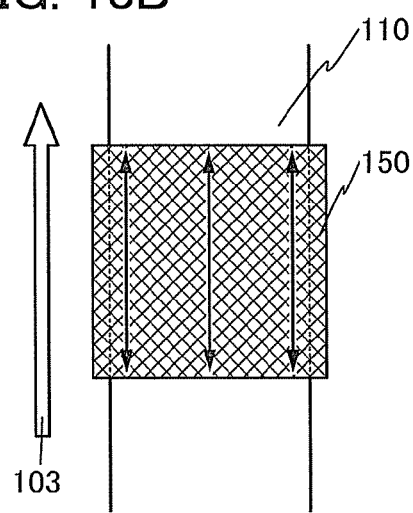

FIG. 18B schematically illustrates the state where scan with the laser beam 150 is performed along the glass layer 110 in the scanning direction 103. Scan with the laser beam 150 is preferably performed in a direction parallel to a pair of opposite sides of the beam spot shape. By such scanning, the middle portion and the perimeter portion of the glass layer are irradiated in one period as indicated by the arrows in the drawing, and thus uniform heating is possible.

Figure 18C:
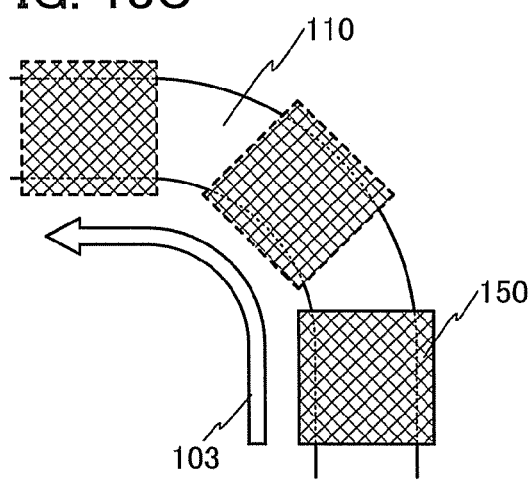

In the case of the glass layer 110 provided to be curved, it is scanned while the laser beam 150 is turned along a curvature of the glass layer 110 as illustrated in FIG. 18C. Thus, even a curved portion can be uniformly heated.

Furthermore, in the case where the glass layer 110 which is melted by the irradiation with the laser beam 150 is cooled and solidified, the solidification proceeds uniformly in one direction, so that concentration of a stress at the middle portion can be prevented; accordingly, a residual stress in the glass layer 110, which may cause a crack, can be reduced.

Here, in particular, when a laser beam having a beam spot shape with a major axis and a minor axis orthogonal to the major axis (linear laser beam) is used as the laser beam, the spot area can be extremely reduced compared with a circular laser beam. Accordingly, the area of a useless region that does not contribute to heating of the glass layer can be reduced, which achieves effective heating of the glass layer. The spot area is preferably reduced also in that energy efficiency can be improved and the glass layer can be effectively heated with lower output than when a circular laser beam is used.

A method for manufacturing the sealed structure using a linear laser beam is described in detail below.

<Spot Shape of Linear Laser Beam>

First, a linear laser beam which can be used for the method for manufacturing a sealed structure in accordance with one embodiment of the present invention is described.

FIG. 1A schematically illustrates the beam spot shape of the linear laser beam 100 and the intensity distributions thereof.

The linear laser beam 100 is a laser beam whose beam spot shape on an irradiated surface has a major axis 101 and a minor axis 102 orthogonal to each other. In FIG. 1A, the linear laser beam 100 having an oblong beam spot shape is illustrated.

In terms of the ratio between the major axis 101 and the minor axis 102, the major axis 101 is longer than at least the minor axis 102. Here, when the major axis 101 is 1.3 or more times as long as the minor axis 102, the beam spot area of the laser beam can be smaller than that of a circular laser beam having a diameter the length of which is the same as the length of the major axis 101. When the linear laser beam 100 having such a beam spot shape is used, energy efficiency can be higher than when a circular laser beam is used; accordingly, the glass layer can be efficiently heated with lower output.

The intensity distribution of the linear laser beam 100 in the direction (X1-X2) along the major axis 101 is preferably uniform as much as possible. For example, the intensity distribution in the direction along the major axis preferably has a flat-top shape. In addition, the intensity distribution of the linear laser beam 100 in the direction (Y1-Y2) along the minor axis 102 is preferably uniform, but may have an intensity distribution in which the intensity varies along the direction (Y1-Y2) like a Gaussian distribution, for example, because the scanning direction and the minor axis 102 are not orthogonal to each other in scan with the linear laser beam 100, as described later.

Figure 1B:
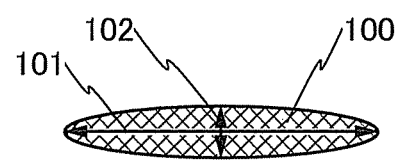
Figure 1C:
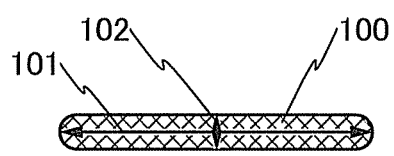

The beam spot of the linear laser beam 100 may take various shapes without being limited to an oblong. For example, the beam spot shape may be an ellipse as illustrated in FIG. 1B or an oblong having rounded corners as illustrated in FIG. 1C.

Figure 1D:
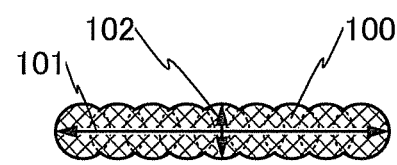
Figure 1E:
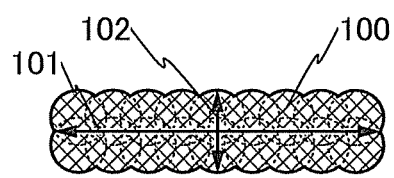
Figure 1F:
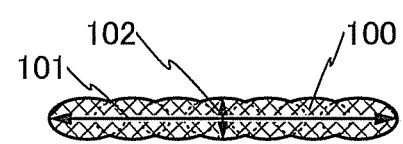

Alternatively, the linear laser beam 100 may be formed in such a way that circular laser beams are overlapped with each other. In FIG. 1D, circular laser beams are partly overlapped with each other in the major axis 101 direction. As in FIG. 1E, circular laser beams are partly overlapped with each other both in the major axis 101 direction and in the minor axis 102 direction. As in FIG. 1F, laser beams having an ellipse shape are partly overlapped with each other in the major axis 101 direction.

A method for optically forming the linear laser beam 100 having a shape described above is described later.

The above explanation is provided of the beam spot shape of the linear laser beam 100.

<Scan with Linear Laser Beam 100>

Next, a scanning method with the linear laser beam 100 for heating the glass layer using the linear laser beam 100 is described.

The glass layer 110 which is in contact with and sandwiched between the first substrate and the second substrate is irradiated with the linear laser beam 100 through the first substrate or the second substrate. At that time, scan with the linear laser beam 100 is performed along the region where the glass layer 110 is provided. By irradiation with the linear laser beam 100, the glass layer 110 is heated and melted; then, the glass layer is cooled and solidified; whereby the first substrate and the second substrate are bonded to each other.

Figure 2:
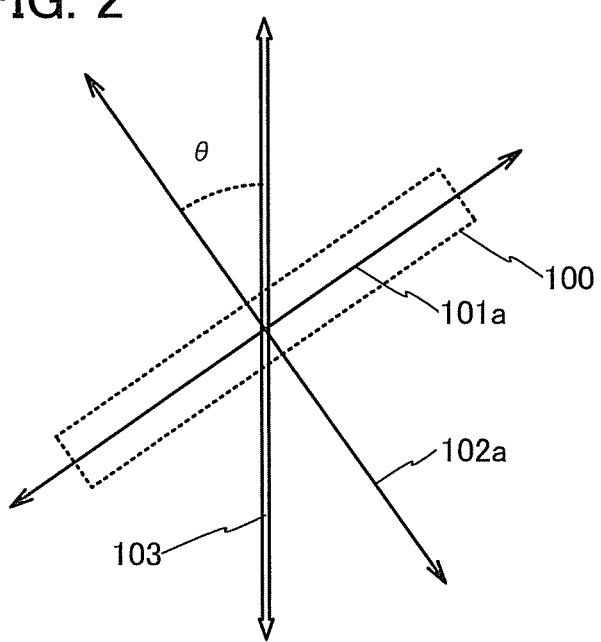
FIG. 2 illustrates a linear laser beam in accordance with one embodiment of the present invention.

Here, an angle formed between the scanning direction, in which scan is performed with the linear laser beam 100, and the major axis or the minor axis of the beam spot of the linear laser beam is described using FIG. 2. For clarity, FIG. 2 illustrates the relationship between the major axis direction 101a parallel to the major axis 101 of the linear laser beam 100, the minor axis direction 102a parallel to the minor axis 102, and the scanning direction 103 of the linear laser beam 100.

Scan is performed with the linear laser beam 100 while it is held so that the scanning direction 103 and the minor axis direction 102a are not orthogonal to each other, i.e., so that a cosine component of the minor axis direction 102a with respect to the scanning direction 103 is not 0 ($\cos(\theta)$ is not 0).

An angle between the scanning direction and the minor axis 102 ($\theta$ in FIG. 2) is preferably greater than or equal to 0° and less than or equal to 60°. When a region having a uniform width is irradiated, the necessary length of the major axis 101 of the beam spot is proportional to $1/\cos(\theta)$, where $\theta$ represents the angle formed between the minor axis 102 and the scanning direction 103. Therefore, when this angle exceeds 60°, the necessary length of the major axis 101 of the linear laser beam 100 increases suddenly, and accordingly the necessary beam spot area enlarges suddenly. Thus, when this angle is less than or equal to 60°, the beam spot area can be small. Further, when these angles are set to less than or equal to 60°, the length of the major axis 101 can be controlled to be less than or equal to twice an effective diameter of the beam spot obtained in the case where a circular laser beam is used, so that an increase in the area of the beam spot of the linear laser beam 100 can be prevented; thus effective irradiation can be performed.

Figure 3A:
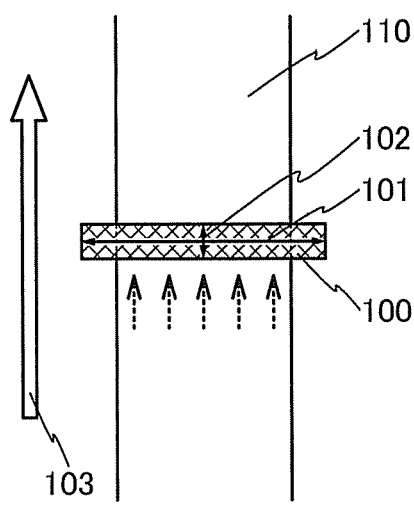
FIGS. 3A and 3B each illustrate a method for scanning a linear laser beam in accordance with one embodiment of the present invention.

Next, FIG. 3A schematically illustrates the case where scan with the linear laser beam 100 is performed along the glass layer 110 so that the angle between the scanning direction 103 and the minor axis 102 can be 0°.

Such scan with the linear laser beam 100 enables uniform heating and melting without a difference in the laser beam irradiation period between the middle portion and the perimeter portion of the glass layer 110.

Further, when the glass layer 110 melted by the linear laser beam 100 are cooled and solidified, the solidification proceeds in one direction along the scanning direction 103 as indicated by the dashed-line arrow in FIG. 3A, and hence concentration of a stress at the middle portion of the glass layer 110 can be made difficult. Accordingly, internal deformation in the glass layer 110 becomes uniform, so that a residual stress in the glass layer 110, which may cause a crack, can be reduced.

Figure 3B:
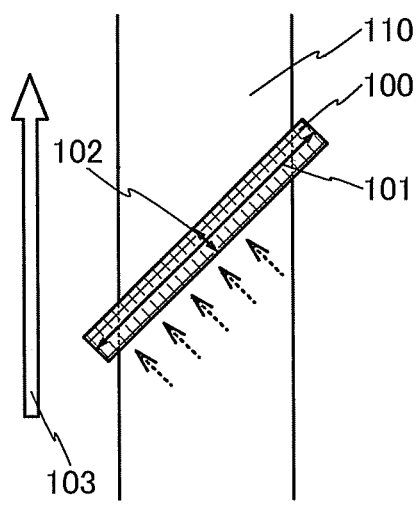

Next, FIG. 3B schematically illustrates the case where scan is performed along the glass layer 110 while the beam spot of the linear laser beam 100 is tilted so that the angle between the scanning direction 103 and the minor axis 102 can exceed 0°.

Also when the linear laser beam 100 is tilted to the scanning direction 103 as described above, uniform heating and melting can be achieved without a difference in the laser beam irradiation period between the middle portion and the perimeter portion of the glass layer 110.

Further, when the glass layer 110 melted by the linear laser beam 100 are cooled and solidified, the solidification proceeds in one direction which is substantially parallel to the minor axis 102 direction of the linear laser beam 100 as indicated by the dashed-line arrow in FIG. 3B. Accordingly, stress concentration in the glass layer 110 can be made difficult, so that a residual stress, which may cause a crack, can be reduced.

In the case where the linear laser beam 100 having an ellipse beam spot shape is used, for example, there may be a difference in the laser beam irradiation period and the melted state between the middle portion and the perimeter portion of the glass layer 110. In such a case, scanning speed, output, or the like is preferably adjusted so as to reduce a difference in the melted state between the middle portion and the perimeter portion. Further, with the use of the linear laser beam 100 having an ellipse beam spot shape, the irradiation period of the perimeter portion of the glass layer 110 is preferably 90% or more, preferably 95% or more, of the irradiation period of the middle portion.

<Methods for Manufacturing Sealed Structure>

Examples of a method for manufacturing a sealed structure including a sealed region surrounded by two opposite substrates and a glass layer, which uses the above-described linear laser beam, is described below.

In formation of the sealed structure, the glass layer is provided over the first substrate so as to form a closed curve. Scan with the linear laser beam is performed along the closed curve. Specifically, scan with the linear laser beam is performed so that an angle formed between the minor axis direction of the beam spot and the tangent of the closed curve is kept in the range greater than or equal to 0° and less than or equal to 60°. A specific scanning method is also described below.

Manufacturing Method Example 1

In this Manufacturing method example, a method in which scan is performed along the glass layer 110 while the minor axis of the linear laser beam 100 is tilted to the scanning direction 103 to manufacture a sealed structure are described using FIGS. 4A to 4F. FIGS. 4A to 4F are schematic top views of this Manufacturing method example.

First, the glass layer 110 is formed over the first substrate 111. The glass layer 110 is provided to form a closed curve having four sides, in which two pairs of two opposite sides are parallel to each other. In other words, the glass layer 110 is provided to have a shape which has two pairs of opposite parallel linear portions and in which two linear portions that are not opposite to each other forms a continuous line at a corner portion.

Here, the shape of the corner portion to which the two linear portions that are not opposite to each other are connected may be a right angle, an acute angle, or an obtuse angle. The corner portion may have curvature or may have a plurality of obtuse angles.

The shapes of the inner and outer edges of the glass layer 110 forming a closed curve may be different. For example, the inner edge may be a quadrilateral while the outer edge is a polygonal.

The shapes of the corner portion and the inner and outer edges of the glass layer 110 described above are determined as appropriate so as to overlap with a region irradiated with the linear laser beam 100, in accordance with a scanning method with the linear laser beam 100 which is described later.

Figure 4A:
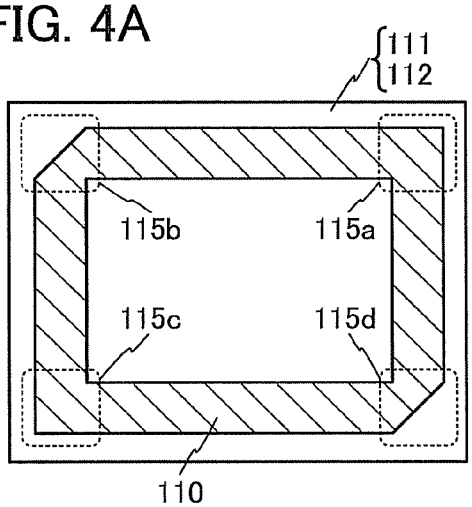
FIGS. 4A to 4F illustrate a method for manufacturing a sealed structure in accordance with one embodiment of the present invention.

In this Manufacturing method example, as illustrated in FIG. 4A, the glass layer 110 is formed so that it has four corner portions (corner portions 115a to 115d) and the inner edge is a quadrilateral while the outer edge is a hexagon, in which each of a pair of opposite corner portions (corner portions 115b and 115d) has two obtuse angles.

The glass layer 110 can be formed as follows: a frit paste in which glass frits formed of powder glass are combined with a binder formed of a resin diluted with an organic solvent, for example, is applied to the first substrate 111 by a known method such as a screen printing method or a dispensing method. Then, the frit paste is subjected to prebaking and the organic solvent and the binder in the frit paste are removed, so that the glass layer 110 can be formed. At this time, in the glass layer 110, the glass fits may be completely melted and then welded to form a whole or the glass frits may be partially welded. An absorbent material which can absorb the laser beam with which the irradiation is performed later may be dispersed in the glass layer 110 after the prebaking. In addition, the binder might fail to be completely removed and remain in the glass layer 110 depending on the conditions for the prebaking.

The glass material used for the glass fits preferably contains one or more compounds selected from, for example, the following group: magnesium oxide, calcium oxide, barium oxide, lithium oxide, sodium oxide, potassium oxide, boron oxide, vanadium oxide, zinc oxide, tellurium oxide, aluminum oxide, silicon dioxide, lead oxide, tin oxide, phosphorus oxide, ruthenium oxide, rhodium oxide, iron oxide, copper oxide, titanium oxide, tungsten oxide, bismuth oxide, antimony oxide, lead borate glass, tin phosphate glass, vanadate glass, and borosilicate glass.

Next, a second substrate 112 is placed to face the first substrate 111 and to be in contact with the glass layer 110 (FIG. 4A).

After that, the glass layer 110 is scanned and irradiated with the linear laser beam 100 through the first substrate 111 or the second substrate 112, so that the glass layer 110 is melted and solidified; accordingly the glass layer 110 are welded to the second substrate 112. At this time, the glass layer 110 and the second substrate 112 are preferably treated while a pressure is applied so that they can be in contact with each other without fail. The glass layer 110 may be treated while the first substrate 111 and the second substrate 112 are interposed using a clamp or the like outside the region irradiated with the laser beam, or may be treated while a pressure is uniformly applied to a substrate surface from one or both of the first substrate and the second substrate.

At this time, the inside of the sealed region is preferably brought into an inert gas atmosphere or a reduced pressure atmosphere after the irradiation with the laser beam. For example, before the irradiation with the laser beam, a sealing material such as an ultraviolet curable resin or a thermosetting resin is formed in advance outside or inside a region where the glass layer 110 is provided; then, the two substrates are temporarily bonded to each other with the sealing material in an inert gas atmosphere or a reduced pressure atmosphere and then irradiated with the laser beam in an air atmosphere or an inert gas atmosphere. When the sealing material is provided to form a closed curve, the structure of an apparatus can be simplified because the inside of the sealed region is kept in an inert gas atmosphere or a reduced pressure atmosphere and the irradiation with the laser beam can be performed in an air atmosphere. Further, when the inside of the sealed region is brought into a reduced pressure atmosphere in advance, the irradiation with the laser beam can be performed while the glass layer 110 and the second substrate 112 are in contact with each other without fail due to a pressure difference, without using a mechanism such as a clamp for pressing the two substrates.

Next, the way how scan with the linear laser beam 100 is performed along the glass layer 110 is described below.

First, the glass layer 110 is scanned with the linear laser beam 100 along one linear portion (also referred to as one side) of the glass layer 110 and irradiated with the laser beam. At this time, irradiation is performed while the minor axis direction of the spot shape of the linear laser beam 100 is tilted to the scanning direction (FIG. 4B). Here, the hatch patterns of the glass layer 110, which has been irradiated with the laser beam, are different for clarity in FIGS. 4A to 4F.

Here, an angle formed between the minor axis direction of the beam spot of the linear laser beam 100 and the scanning direction 103 is preferably set to 45°. When the angle formed between the minor axis direction and the scanning direction 103 is set to 45°, this angle is constantly kept 45° over the four sides of the glass layer 110, especially in the case where a right angle is formed between two sides of the glass layer 110 which are not opposite to each other. Hence, even when conditions for the irradiation with the laser beam are common to the two sides that are not opposite to each other, the melted state of the glass layer can be equalized and the welded state of the glass layer can be uniform; thus, a highly reliable sealed structure can be formed.

In this Manufacturing method example, the case where the angle formed between the minor axis direction of the beam spot shape of the glass layer 110 and the scanning direction 103 is set to 45° is described.

Figure 4D:
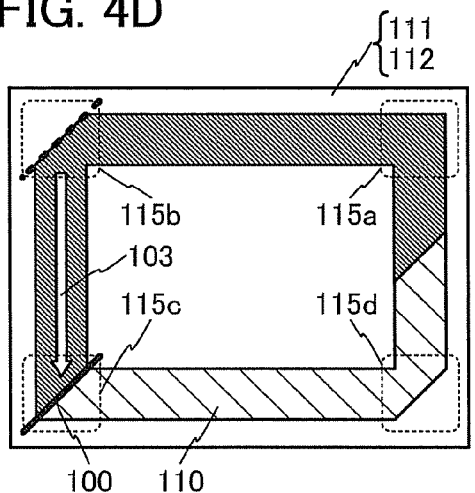
Figure 4B:
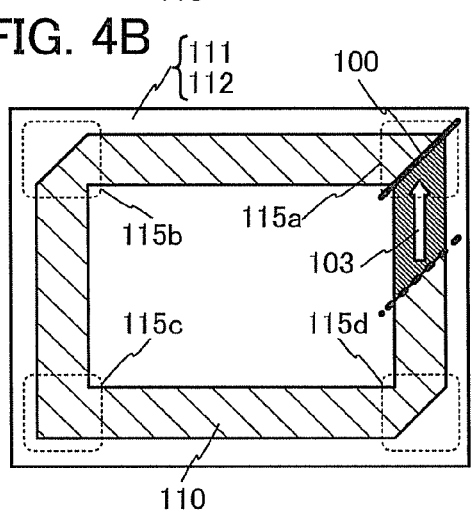
Figure 4E:
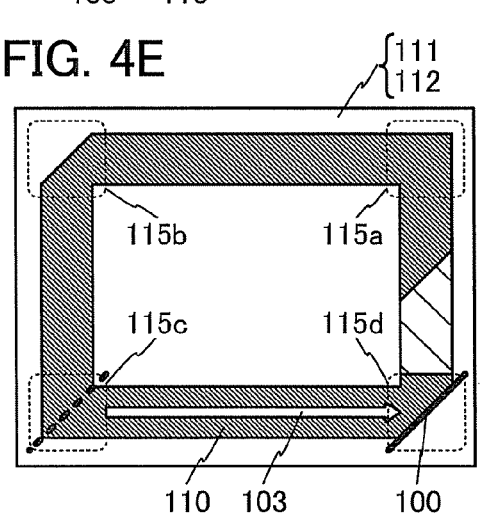
Figure 4C:
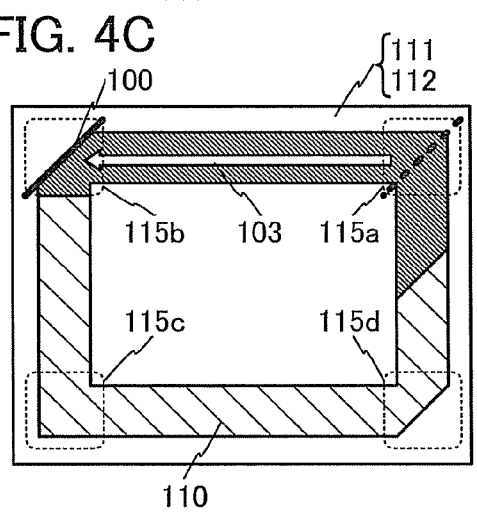

Next, after the linear laser beam 100 reaches the corner portion 115a of the glass layer 110, scan is then performed along the glass layer 110 toward the corner portion 115b (FIG. 4C).

Next, after the linear laser beam 100 reaches the corner portion 115b of the glass layer 110, scan is then performed along the glass layer 110 toward the corner portion 115c (FIG. 4D).

Here, since the minor axis direction of the beam spot of the linear laser beam 100 is tilted to the scanning direction 103 in scanning, part of the corner portion 115b is irradiated with the laser beam twice. Therefore a condition for irradiation with the linear laser beam 100 is preferably changed at the corner portion 115b. For example, at the corner portion 115b, scanning speed is increased or irradiation intensity is reduced.

After that, scan with the linear laser beam 100 is performed as described above along the glass layer 110 from the corner portion 115c toward the corner portion 115d (FIG. 4E).

Figure 4F:
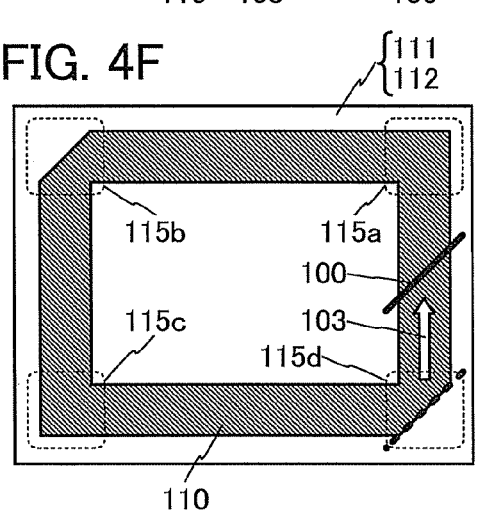

After the linear laser beam 100 reaches the corner portion 115d, scan with the linear laser beam 100 is performed to an irradiation starting region between the corner portion 115d and the corner portion 115a (FIG. 4F). At this time a condition for irradiation with the linear laser beam 100 is preferably changed at the corner portion 115*d*, as at the corner portion 115*b*.

Thus, a sealed structure including a sealed region in which the first substrate 111 and the second substrate 112 are sealed with the glass layer 110 can be manufactured.

In one embodiment of the present invention, because of the use of the linear laser beam 100, the area of the region that is irradiated with the laser beam twice (also referred to as an overlap region) in the irradiation starting region can be extremely smaller than that with the use of a circular laser beam. In the overlap region, the melted state of the glass layer 110 is different from that of the other region, here, a difference in the melted state might cause stress concentration to generate a crack. By use of the linear laser beam 100, the area of the overlap region can be extremely small; accordingly, few cracks are generated and a highly reliable sealed structure can be fabricated.

Manufacturing Method Example 2

A method for manufacturing a sealed structure, which is different from that in the above Manufacturing method example, is described. The linear laser beam 100 used in this Manufacturing method example not only can be used for scan along the glass layer 110 but also can be turned around a turn axis perpendicular to an irradiated surface.

Scan with the linear laser beam 100 is performed along the glass layer 110 provided to form a closed curve having four sides in which two pairs of two opposite sides are parallel so that the beam spot can be turned 90° at a corner portion or in a region between two corner portions that are not opposite to each other, whereby the sealed structure with corner portions having the same shapes can be manufactured.

Figure 5A:
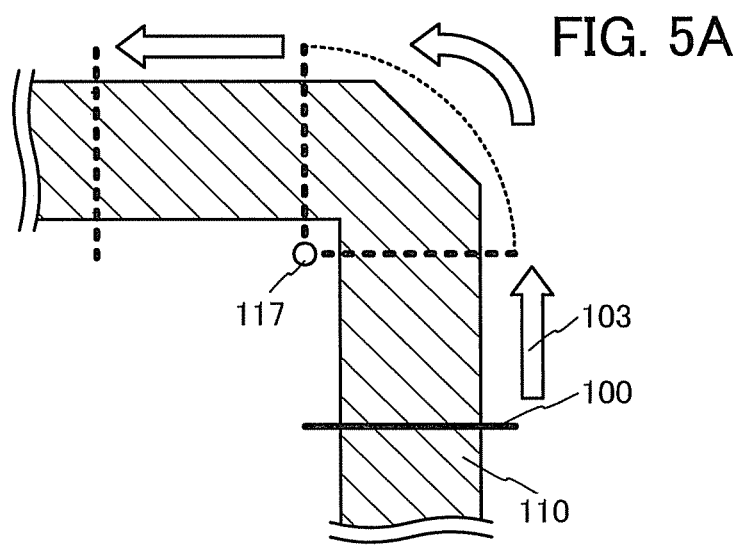
FIGS. 5A and 5B each illustrate a method for manufacturing a sealed structure in accordance with one embodiment of the present invention.
Figure 5B:
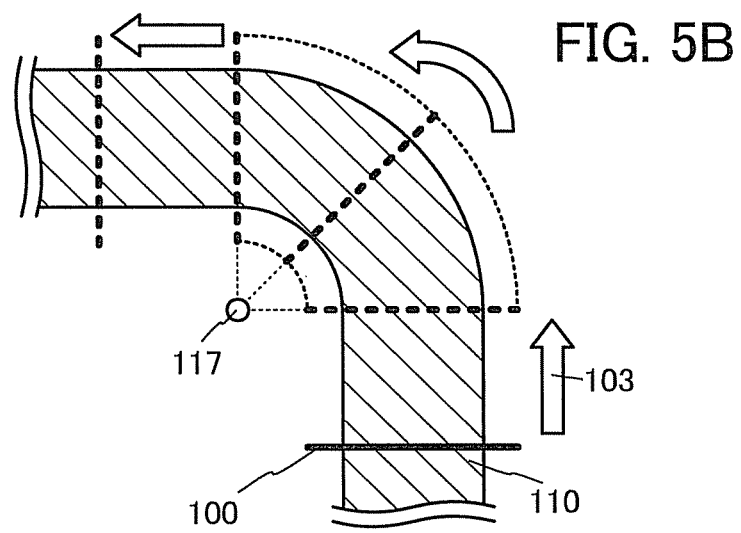

FIGS. 5A and 5B illustrate examples of methods in each of which scan is performed so that the beam spot of the linear laser beam 100 can be turned 90° at a corner portion.

In the method illustrated in FIG. 5A, the angle formed between the minor axis direction of the beam spot of the linear laser beam 100 and the scanning direction 103 is greater than or equal to 0° and less than or equal to 60° over a linear portion (side) of the glass layer 110. In this Manufacturing method example, scan is performed so that the angle can be 0°.

When the linear laser beam 100 reaches the corner portion, scan is performed in such a way that the linear laser beam 100 is turned around a turn axis 117. At this time, the linear laser beam 100 is turned so that one end in the major axis direction of the linear laser beam 100 can constantly correspond to the turn axis 117.

After that, scan with the linear laser beam 100 is performed along the glass layer 110. At this time, since the beam spot of the linear laser beam 100 is turned 90° at the corner portion, the angle formed between the minor axis direction and the scanning direction 103 can constantly be the same (0° here) on the two sides forming a continuous line at the corner portion.

The shape of the glass layer 110 at the corner portion is adjusted so that it can overlap with a region irradiated with the linear laser beam 100. In FIG. 5A, the glass layer 110 is provided so as to have an inner edge having a right angle and an outer edge having two obtuse angles at the corner portion.

At the four corner portions of the glass layer 110 as described above, a sealed structure sealed with the glass layer 110 with corner portions having the same shapes can be fabricated. By having the same shapes, the corner portions do not differ in residual stress caused by internal deformation, which leads to a highly reliable sealed structure.

In FIG. 5B, the turn axis 117 does not correspond to one end of the major axis of the linear laser beam 100. Scan is performed so that the beam spot of the linear laser beam 100 can be turned around a point on the extension of the major axis, which serves as the turn axis 117.

Such scan can reduce a difference in the scanning speed between the inner portion and the perimeter portion when the beam spot of the linear laser beam 100 is turned. Accordingly, variation in the internal stress of the glass layer 110 at the corner portion can be small, so that few cracks are generated.

As illustrated in FIG. 5B, the outer and inner edges of each corner portion can be shaped like an arc. With such corner portions having curvature, an internal stress in the glass layer 110 can be diminished, so that generation of a crack can be made more difficult. In this case, the curvature radius is preferably large.

Manufacturing Method Example 3

In this Manufacturing method example, a method in which the beam spot of the linear laser beam 100 is turned in a region including a linear portion (side) of the glass layer 110 is described, although the method in which the beam spot is turned at a corner portion is described in the above Manufacturing method example 2.

Figure 6A:
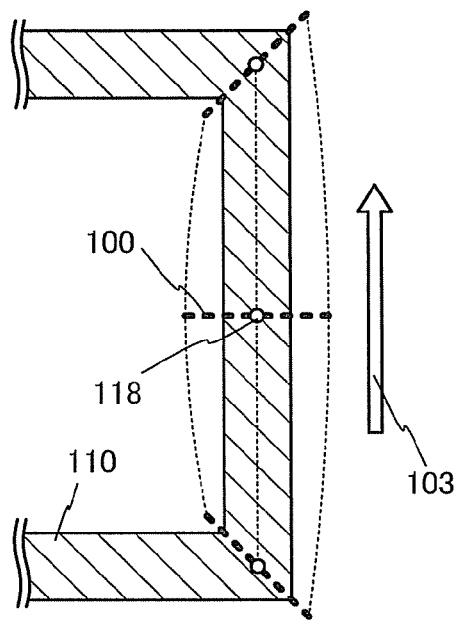
FIGS. 6A to 6C each illustrate a method for manufacturing a sealed structure in accordance with one embodiment of the present invention.

FIG. 6A illustrates the state in which scan is performed so that the beam spot of the linear laser beam 100 can be turned 90° between two corner portions that are not opposite to each other. In FIG. 6A, scan is performed so that the locus of a center 118 of the linear laser beam 100 can be parallel to the scanning direction 103.

When scan is thus performed so that the center 118 of the beam spot of the linear laser beam 100 can overlap with the middle portion of the glass layer 110, use of an end portion of the linear laser beam 100, which has a relatively low intensity, is unnecessary and accordingly the glass layer 110 can be uniformly heated.

Figure 6B:
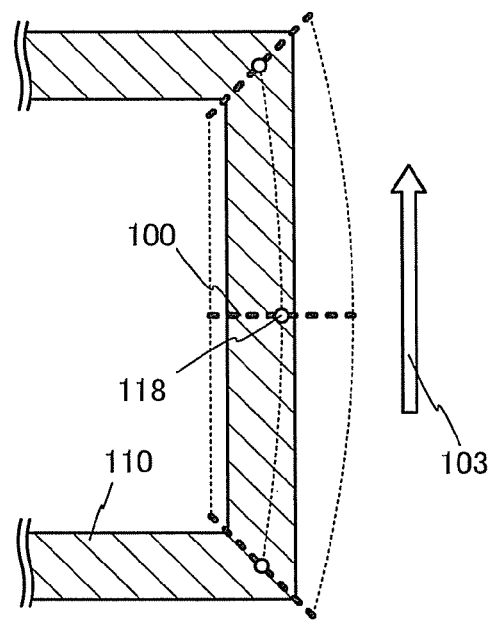
Figure 6C:
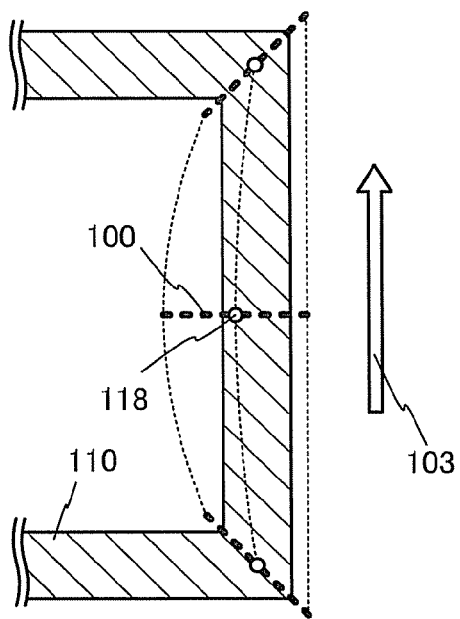

Alternatively, the locus of the center 118 of the beam spot of the linear laser beam 100 can be shaped like an arc, as illustrated in FIGS. 6B and 6C.

For example, in order that the area of a portion inside the sealed region which is irradiated with the laser beam can be reduced, specifically, in order that a circuit element, a light-emitting element, or the like can be formed even in the vicinity of the glass layer 110, scan is performed so that the locus of the center 118 can be shaped like an arc outside the sealed region as in FIG. 6B. Consequently, the locus of the laser beam in the sealed region can be linear.

In contrast, in order that the area of a portion outside the sealed region which is irradiated with the laser beam can be reduced, specifically, in order that a display device with a narrow frame can be formed, scan is performed so that the locus of the center 118 can be shaped like an arc inside the sealed region as in FIG. 6C. Consequently, the locus of the laser beam outside the sealed region can be linear.

In the scanning method illustrated in FIG. 7, scan is performed so that the beam spot of the linear laser beam 100 can be turned 90° at a linear portion and so that an angle between the minor axis direction and the scanning direction can be 45° at the corner portion as described in the above Manufacturing method example. Note that although scan is performed so that the locus of the center 118 can be parallel to the scanning direction at a linear portion in FIG. 7, the locus may be shaped like an arc as described above.

In such a scanning method, the glass layer 110 with corner portions having the same shapes can be formed and uniform irradiation can be performed by linear scan at the corner portions without generating a difference in the laser beam irradiation period between the middle portion and the perimeter portion; thus, a sealed structure which has few cracks can be fabricated.

The above explanation is provided of the scanning method with the linear laser beam 100.

[Method for Forming Linear Laser Beam 100]

A method for optically forming the linear laser beam 100 is described below.

FIGS. 8A to 8D illustrate schematic views in the case where the linear laser beam 100 is formed by overlapping with the plurality of circular laser beams with which a surface to be irradiated 123 is irradiated from an exit hole 121.

As an exit hole 121 through which the laser beam is emitted, for example, an optical fiber is used and may be directly connected to a laser oscillator so that the laser beam can be extracted. Any of mirrors and lenses may be combined so that the laser beam can be extracted.

Here, by using an optical fiber as described above whose cross section is a square, the laser beam 150 having a square beam spot shape as exemplified in FIGS. 18A to 18C can be formed. Alternatively, by using an optical fiber whose cross section is an oblong, the linear laser beam 100 having an oblong beam spot shape with a major axis and a minor axis orthogonal to the major axis can be formed. Further alternatively, concentration of light with a mirror or a lens may be utilized to form a square or oblong beam spot on an irradiated surface so that the laser beam 150 or the linear laser beam 100 can be formed.

Alternatively, the linear laser beam 100 can also be formed in such a way that circular laser beams are overlapped with each other. FIGS. 8A to 8D are schematic views each illustrating the case where circular laser beams emitted through exit holes 121 to an irradiated surface 123 are overlapped with each other to form the linear laser beam 100.

Figure 8A:
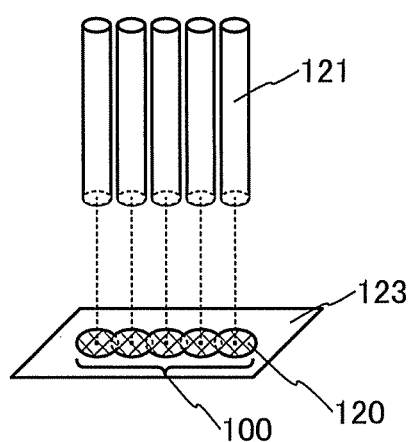
FIGS. 8A to 8D each illustrate a linear laser beam in accordance with one embodiment of the present invention.

In FIG. 8A, the exit holes 121 are arranged at equal intervals on a straight line and the circular laser beams 120 emitted through the exit holes 121 are overlapped with each other; thus, the linear laser beam 100 having a linear beam spot can be formed on the irradiated surface 123.

In this case, when the exit holes 121 are arranged so that the beam spots of the circular laser beams 120 can be partly overlapped with each other, the intensity distribution in the major axis direction of the beam spot of the linear laser beam 100 can be made closer to a uniform distribution.

Figure 8B:
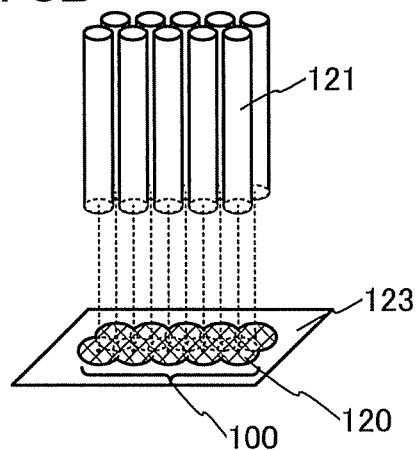

Alternatively, as illustrated in FIG. 8B, a matrix of exit holes 121 may be arranged in the horizontal and vertical directions to form the linear laser beam 100. This structure leads to improve intensity distribution in the minor axis direction of the linear laser beam 100 and a wide width in the minor axis direction.

Figure 8C:
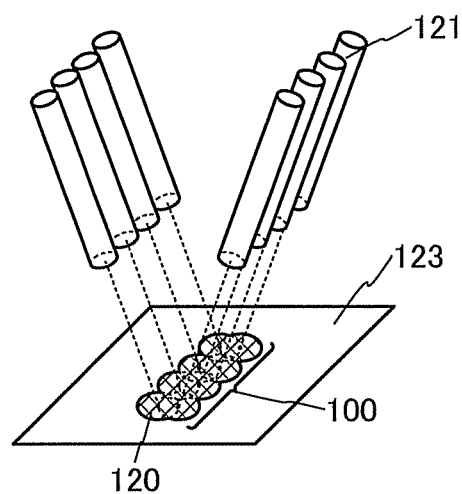

Alternatively, as illustrated in FIG. 8C, groups of exit holes including the plurality of exit holes 121 arranged at equal intervals on a straight line may be arranged while being tilted to the direction perpendicular to the irradiated surface 123 so that the circular laser beams 120 emitted through the plurality of exit holes 121 can be condensed on the irradiated surface 123 to form the linear laser beam 100.

This structure can improve the intensity distributions of the linear laser beam 100 and reduce the width in the minor axis direction.

Figure 8D:
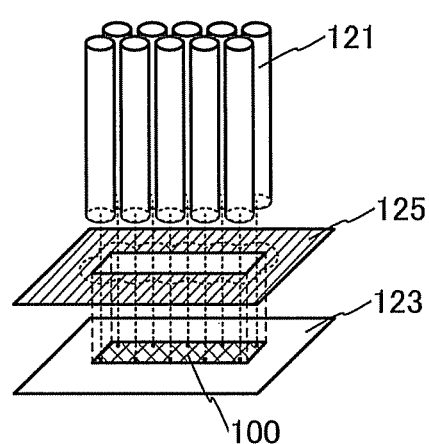

Alternatively, as illustrated in FIG. 8D, a light-blocking mask 125 having an opening may be provided between the plurality of exit holes 121 and the irradiated surface 123 so that the linear laser beam 100 having a beam spot shape reflecting the shape of the opening of the light-blocking mask can be formed. When the light-blocking mask blocks an outer end portion of the laser beam 100, which has a relatively low intensity, in this way, the intensity distributions of the linear laser beam 100 is improved and the beam spot of the linear laser beam 100 can take any shape.

A lens may be used to condense the linear laser beam 100 on the irradiated surface 123.

Figure 9A:
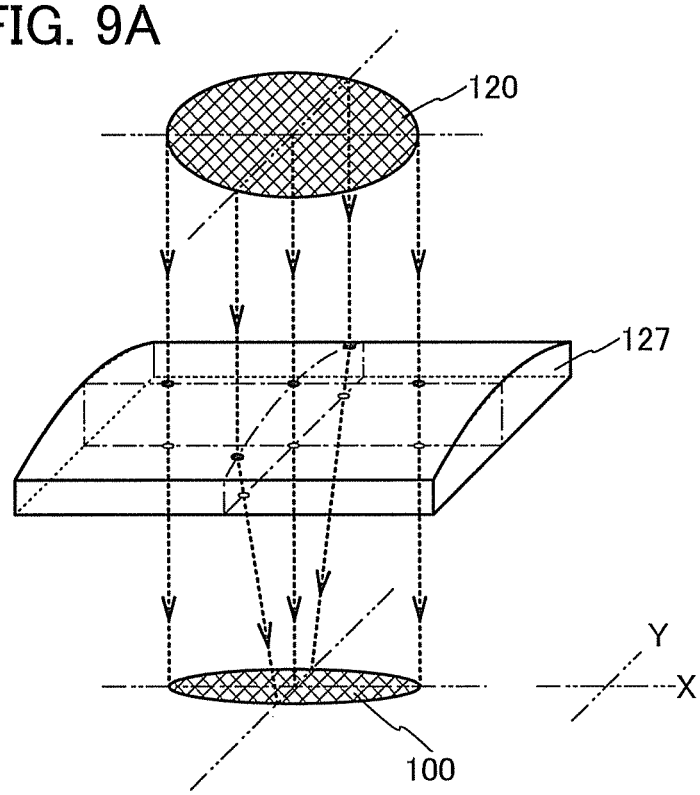
FIGS. 9A and 9B each illustrate a linear laser beam in accordance with one embodiment of the present invention.

FIG. 9A is a schematic view illustrating the case where a cylindrical lens 127 is used to condense the circular laser beam 120 so that the linear laser beam 100 having an ellipse beam spot can be formed.

The cylindrical lens 127 can converge or diverge light only in one axis direction. As illustrated in FIG. 9A, when the circular laser beam 120 enters the cylindrical lens 127, the circular laser beam 120 is converged only in the Y axis direction, so that it has an ellipse beam spot after passing through the cylindrical lens 127. Thus, the linear laser beam 100 can be formed with the circular laser beam 120.

Instead of the cylindrical lens 127, a toroidal lens with different curvatures in two orthogonal axes may be used. The toroidal lens enables concentration of light or divergence also in the major axis direction, so that not only the length of the minor axis of the beam spot but also the length of the major axis thereof can be controlled. Alternatively, an aspheric lens or the like may be used for concentration of light so that a desired beam spot can be obtained.

Figure 9B:
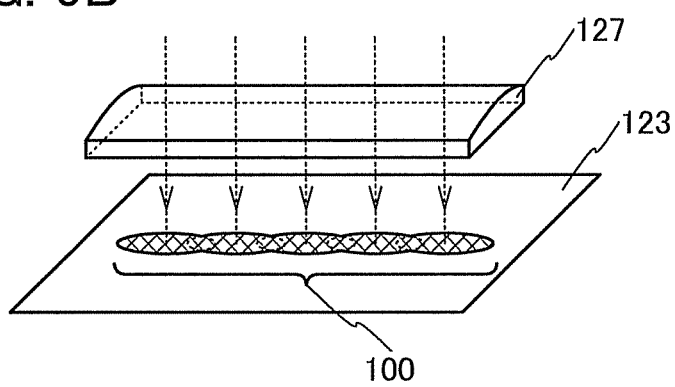

Alternatively, as illustrated in FIG. 9B, a plurality of circular laser beams may be condensed on the irradiated surface 123 through the cylindrical lens 127 so that the beam spots of the circular laser beams can be partly overlapped with each other to form the linear laser beam 100. With this structure, the linear laser beam 100 can have a narrow width in the minor axis direction and high energy density.

Note that when scan is performed in such a way that the beam spot of the linear laser beam 100 is turned, groups of exit holes are provided capable of being turned around the axis perpendicular to the irradiated surface. Alternatively, when a lens is used, the lens is provided capable of being turned.

Alternatively, the irradiated surface may be provided capable of being turned while the beam spot of the linear laser beam 100 is not turned. For example, as a stage supporting a substrate having a surface to be irradiated, a stage which is not only movable in the X-direction and the Y-direction but also provided with a turn axis perpendicular to the X-Y plane is used.

According to a method for manufacturing a sealed structure of an embodiment of the present invention which is described in this embodiment, internal stress inside the glass layer is reduced, so that a sealed structure in which few cracks are generated can be formed.

This embodiment can be combined with any of the other embodiments described in this specification as appropriate.

Embodiment 2

In this embodiment, a sealed structure formed by the manufacturing method described in Embodiment 1 will be described with reference to FIGS. 10A and 10B.

Figure 10A:
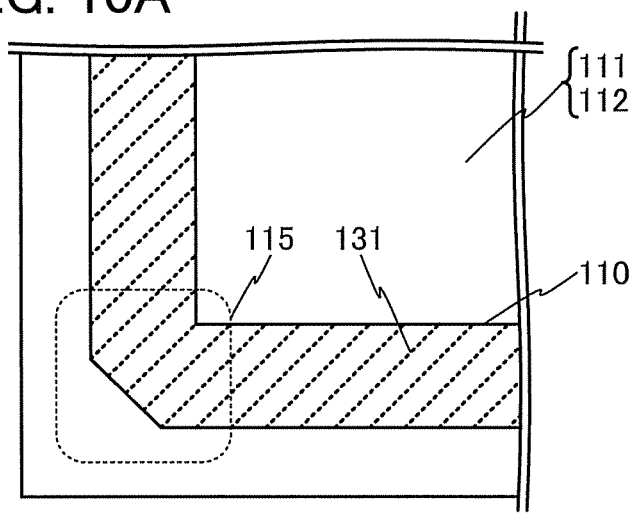
FIGS. 10A and 10B each illustrate a sealed structure in accordance with one embodiment of the present invention.

FIG. 10A is a schematic view of an observed image of a vicinity of one corner portion 115 of the glass layer 110 in the sealed structure formed by the manufacturing method described as an example in Manufacturing method example 1, which is observed with an optical microscope through the first substrate 111 or the second substrate 112.

When the glass layer 110 is observed by using the optical microscope, as illustrated in FIG. 10A, a stripe 131 which is substantially parallel to a straight line connecting the inside and outside of a sealed region is found in some cases. Further, the direction of the stripe 131 substantially corresponds to a major-axis direction of the beam spot of the linear laser beam 100 in the case of irradiating the glass layer 110 with a laser beam.

One of factors for finding such a stripe 131 is a difference in density which is generated in the glass layer 110 when the glass layer 110 is melted by irradiation with a laser beam and the glass layer 110 is cooled and solidified. According to the difference in density, regions are formed, which have different optical characteristics such as reflective index and reflectance; then the regions are found with the optical microscope or the like. Such regions having different optical characteristics reflect a beam spot shape and a scanning direction of a laser beam that is emitted; therefore, in the case where the linear laser beam 100 as described in Embodiment 1 as an example is used, the stripe 131 may be found.

Further, the stripe 131 is seen notably in the case where a pulse laser beam is used as a laser beam which is used. Furthermore, even in the case where a CW (continuous wave) laser beam is used, the stripe 131 can be found in accordance with irradiation condition such as scanning speed.

The stripe 131 is formed from a difference in the optical characteristics such as the reflective index and reflectance as described above; therefore, the stripe can also be found by a phase contrast microscope, a polarizing microscope, a differential interference contrast microscope, or the like other than a general optical microscope.

Figure 10B:
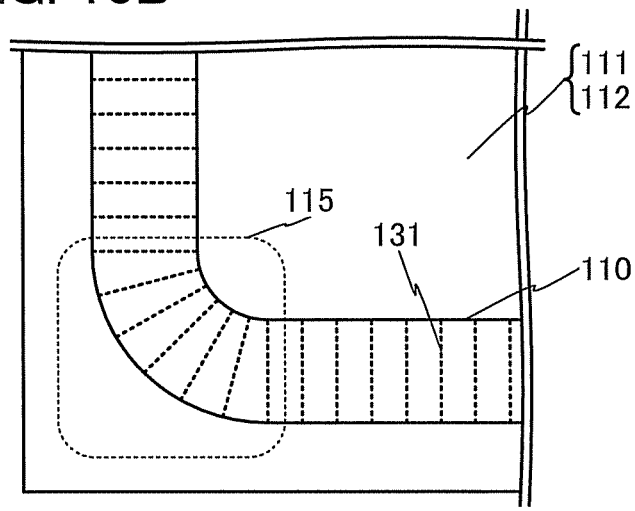

FIG. 10B shows a schematic view of an observation image by an optical microscope of the sealed structure formed by the manufacturing method in FIG. 5B referred to in Manufacturing method example 2 as an example.

At the corner portion 115, scan is performed with the linear laser beam 100 in such a manner that the beam spot is turned 90° and the glass layer 110 is irradiated with a laser beam, so that a radial stripe 131 is found in a direction from the inside the sealed region to the outside of the sealed region in the corner. Further, in a line portion, a stripe 131 which is substantially parallel to a straight line connecting the inside and outside of a sealed region can be found.

As illustrated in FIGS. 10A and 10B, in the glass layer 110 in which the stripe 131 substantially parallel to a straight line connecting the inside and outside of the sealed region can be found, the density is always formed uniformly in a cross section which is parallel to the straight line. As a result, in the glass layer 110 in which the stripe 131 as described above is found, the density is uniform linearly in a direction from the inside the sealed region to the outside of the sealed region; therefore, deformation inside the glass layer is extremely small and the internal stress is reduced. By applying such a glass layer 110, a sealed structure in which few cracks are generated is significantly suppressed can be achieved.

Here, for example, in the case where a circular laser beam is used, the linear stripes 131 illustrated in FIG. 10A or 10B are not found, but an arc-shaped stripe is found. In a glass layer in which the arc-shaped stripe is found, the large internal stress is concentrated in the middle portion; therefore, the crack due to the internal stress is generated with a high probability.

This embodiment can be combined with any of the other embodiments disclosed in this specification as appropriate.

Embodiment 3

In this embodiment, a light-emitting device to which the sealed structure and the method for manufacturing the sealed structure which are described in the above embodiments can be applied will be described. Hereinafter, as examples of the light-emitting device, display devices to which an organic EL element is applied are described with reference to FIGS. 11A and 11B and FIG. 12.

Structural Example 1

In this structural example, a display device in which an organic EL element is applied will be described with reference to FIGS. 11A and 11B.

FIG. 11A is a schematic top view of a display device 200 of an embodiment of the present invention. The display device 200 described in this structural example has a so-called top-emission structure, which emits light to the opposite side to the substrate over which a light-emitting element is provided.

In the display device 200, a display portion 201, a scan line driver circuit 202, and a signal line driver circuit 203 are included in a sealed region surrounded by a first substrate 111, a second substrate 112, and a glass layer 110. Further, a wiring which is electrically connected to the scan line driver circuit 202 and the signal line driver circuit 203 extends from the sealed region, and the wiring is electrically connected to an external input terminal 205. Through an FPC 207 which is electrically connected to the external input terminal 205, a power source potential and a signal such as driving signal for driving the scan line driver circuit 202, the signal line driver circuit 203, and the like can be input.

FIG. 11B is a schematic cross-sectional view along the lines A-B and C-D of FIG. 11A, which pass through regions including the external input terminal 205, the scan line driver circuit 202, and the display portion 201.

The external input terminal 205 is formed using a conductive layer included in transistors or a light-emitting element in the display device 200. In this structural example, the external input terminal 205 includes a stack of a conductive layer used as the gates of the transistors and a conductive layer used as electrodes of the transistors. It is preferable that the external input terminal 205 include a stack of a plurality of conductive layers, in which case strength can be increased. A connector 209 is provided in contact with the external input terminal 205. The FPC 207 is electrically connected to the external input terminal 205 through the connector 209. The connector 209 can be formed using a paste-form or sheet-form material that is obtained by mixing metal particles to a thermosetting resin and exhibits anisotropic conductivity by thermocompression bonding. As the metal particles, particles in which two or more kinds of metals are layered, for example, Ni particles coated with Au are preferably used.

In FIG. 11B, the scan line driver circuit 202 includes an NMOS circuit in which n-channel transistors, transistors 211 and 212, are used in combination, as an example. Note that the scan line driver circuit 202 is not limited to an NMOS circuit; various CMOS circuits in which an n-channel transistor and a p-channel transistor are used in combination, PMOS circuits composed of p-channel transistors, or the like are applicable to the scan line driver circuit 202. Note that the same applies to the signal line driver circuit 203. Although this structural example shows a driver-integrated structure in which the scan line driver circuit 202 and the signal line driver circuit 203 are formed over the substrate over which the display portion 201 is formed, the scan line driver circuit 202 or the signal line driver circuit 203, or both may be formed over a substrate different from that over which the display portion 201 is formed.

FIG. 11B illustrates a cross-sectional structure of one pixel as an example of the display portion 201. The pixel includes a switching transistor 213, a current control transistor 214, and a pixel electrode 223 that is electrically connected to an electrode (a source electrode or a drain electrode) of the current control transistor 214. An insulating layer 217 is formed to cover an end portion of the pixel electrode 223.

Note that there is no particular limitation on the structures of the transistors included in the display portion 201, the scan line driver circuit 202, and the signal-line driver circuit 203. For example, a forward staggered transistor or an inverted staggered transistor may be used. Furthermore, a top-gate transistor or a bottom-gate transistor may be used. As a material of a semiconductor used for the transistors, for example, a semiconductor material such as silicon or germanium or an oxide semiconductor containing at least one of indium, gallium, and zinc may be used. Further, there is no particular limitation on the crystallinity of a semiconductor used for the transistors, and an amorphous semiconductor or a semiconductor having crystallinity (a microcrystalline semiconductor, a polycrystalline semiconductor, a single crystal semiconductor, or a semiconductor partly including crystal regions) may be used. It is preferable that a semiconductor having crystallinity be used, in which case deterioration of the transistor characteristics can be suppressed.

A light-emitting element 220 includes the pixel electrode 223, an EL layer 225, and a common electrode 227. The structure, materials, and the like of the light-emitting element will be described in detail in the following embodiment.

As conductive materials for the pixel electrode 223 and the common electrode 227, a material that transmits light emitted from the EL layer 225 is used for an electrode through which light is transmitted, and a material that reflects light emitted from the EL layer 225 is used for an electrode provided on the side opposite to the electrode through which light is transmitted.

In this structural example, a reflective material is used as the pixel electrode 223 and a light-transmitting material is used as the common electrode 227. Thus, light emission from the EL layer 225 is emitted to the second substrate 112 side.

As the light-transmitting material that can be used for the electrode through which light is transmitted, the conductive oxide such as indium oxide, indium tin oxide, indium zinc oxide, zinc oxide, zinc oxide to which gallium is added, graphene, and the like can be used. Other examples are a metal material such as gold, silver, platinum, magnesium, nickel, tungsten, chromium, molybdenum, iron, cobalt, copper, palladium, and titanium; and an alloy material containing any of these metal materials. Further alternatively, a nitride of the metal material (e.g., titanium nitride) or the like may be used. In the case of using the metal material (or the nitride thereof), the conductive layer may be thinned so as to be able to transmit light. Alternatively, a stack of any of the above materials can be used as the conductive layer. For example, a layered film of a silver-magnesium alloy and indium tin oxide is preferably used because the conductivity can be increased.

Note that the conductive oxide used as the electrode through which light is emitted can be formed by a sputtering method. When a conductive oxide film is formed under an atmosphere containing argon and oxygen, a light-transmitting property can be increased.

Further, in the case of a top-emission structure, it is preferable that the conductive oxide film formed over the EL layer 225 be a stacked layer film of a first conductive oxide film formed under an atmosphere containing argon with reduced oxygen concentration and a second conductive oxide film formed under an atmosphere containing argon and oxygen, in which case film formation damage to the EL layer 225 can be reduced. Here, when the first conductive oxide film is formed, the purity of an argon gas is preferably high, and for example, it is preferable to use the argon gas whose dew point is lower than or equal to −70° C., more preferably lower than or equal to −100° C.

As a light-reflecting material that can be used for the electrode provided on the side opposite to the electrode through which light is transmitted, the following can be used: a metal material such as aluminum, gold, platinum, silver, nickel, tungsten, chromium, molybdenum, iron, cobalt, copper, and palladium; or an alloy material containing any of these metal materials. Alternatively, lanthanum, neodymium, germanium, or the like may be added to the metal material or the alloy material. As an example of the alloy material, any of the following can also be used: alloys containing aluminum (aluminum alloys) such as an alloy of aluminum and titanium, an alloy of aluminum and nickel, and an alloy of aluminum and neodymium; and alloys containing silver such as an alloy of silver and copper and an alloy of silver and magnesium. An alloy of silver and copper is preferable because of its high heat resistance. Further, by stacking a metal film or a metal oxide film in contact with an aluminum alloy film, oxidation of the aluminum alloy film can be suppressed. Examples of a material for the metal film or the metal oxide film are titanium and titanium oxide. Alternatively, the conductive layer may be a stack of a film containing any of the above light-transmitting materials and a film containing any of the above metal materials. For example, the conductive layer can be a stack of silver and indium tin oxide or a stack of an alloy of silver and magnesium and indium tin oxide.

The insulating layer 217 is provided to cover the end of the pixel electrode 223. Moreover, an upper end portion or a lower end portion of the insulating layer 217 preferably has a curved surface with a radius of curvature of 0.2 μm to 3 μm in order to be adequately covered with the common electrode 227 which is formed over the insulating layer 217. As a material of the insulating layer 217, an organic compound such as a negative photosensitive resin or a positive photosensitive resin, or an inorganic compound such as silicon oxide or silicon oxynitride can be used.

An insulating layer 215 is formed over a surface of the first substrate 111. The insulating layer 215 reduces diffusion of impurities included in the first substrate 111. The insulating layers 216 and 218, which are in contact with a semiconductor layer in the transistors, and the insulating layer 219, which covers the transistors, preferably reduce diffusion of impurities into the semiconductor included in the transistors. For these insulating layers, for example, a semiconductor such as silicon, oxide or nitride of metal such as aluminum can be used. Alternatively, a stack of such an inorganic insulating material or a stack of such an inorganic insulating material and an organic insulating material may be used. Note that the insulating layer 215 is not necessarily provided when not needed.

The second substrate 112 is provided with a color filter 229 to overlap with the light-emitting element 220. The color filter 229 is provided in order to match the color of light emitted from the light-emitting element 220. For example, in a full-color display device using white light-emitting elements, a plurality of pixels provided with color filters of different colors are used. In that case, the color filters may be formed of three colors of R (red), G (green), and B (blue) or four colors (yellow (Y) in addition to these three colors). Further, a white (W) pixel may be added to the R pixel, the G pixel, and the B pixel (and the Y pixel). That is, four colors (or five colors) may be used.

Further, a black matrix 231 is provided between the adjacent color filters 229. The black matrix 231 shields a pixel from light emitted from the light-emitting element 220 in an adjacent pixel, thereby preventing color mixture between the adjacent pixels. Here, the color filter 229 is provided so that its end portion overlaps with the black matrix 231, whereby light leakage can be reduced. The black matrix 231 can be formed using a material that shields light emitted from the light-emitting element 220, for example, a metal or an organic resin including a pigment. Note that the black matrix 231 may be provided in a region other than the display portion 201, for example, in the scan line driver circuit 202.

In addition, an overcoat 233 is formed to cover the color filter 229 and the black matrix 231. The overcoat 233 is formed using a material that transmits light emitted from the light-emitting element 220, and can be an inorganic insulating film or an organic insulating film, for example. Note that the overcoat is not necessarily provided when not needed.

Although the cross-sectional view in FIG. 11B illustrates only one light-emitting element 220, a display device capable of full-color display can be provided by including light-emitting elements that emit light of three colors (R, G, and B) in the display portion 201. Moreover, a display device capable of full-color display can be provided by using a combination of color filters and a light-emitting element including an EL layer that emits white light, which is exemplified in an embodiment below. The light-emitting element is not limited to having a top emission structure, and can have any of a bottom emission structure and a dual emission structure. A structural example of a light-emitting device having a bottom emission structure will be described in Structural example 2.

The first substrate 111 and the second substrate 112 are bonded to each other at the outer edge portion of the second substrate 112 by using the glass layer 110. The glass layer 110 can have any of the structures described in the above embodiments.

The light-emitting element 220 is provided in the sealed region surrounded by the first substrate 111, the second substrate 112, and the glass layer 110. The sealed region may be filled with an inert gas such as a rare gas or a nitrogen gas, a solid such as organic resin, or a viscous material such as a gel, or may contain a reduced pressure atmosphere. Impurities such as water and oxygen in the sealed region are preferably small, in which case the reliability of the light-emitting element 220 is increased.

Moreover, when an insulating film covering the light-emitting element 220 is provided, the light-emitting element 220 is not exposed, so that the reliability of the light-emitting element can be increased. As the insulating film, a material which does not transmit impurities such as moisture or oxygen is used. For example, an inorganic insulating film such as a film of an oxide or a nitride of silicon or aluminum can be used.

Further, a drying agent may be provided in a region which is not overlapped with the light-emitting element 220 in the sealed region. As the drying agent, for example, a substance which absorbs moisture by chemical adsorption, such as an oxide of an alkaline earth metal (e.g., calcium oxide or barium oxide), can be used. Alternatively, a substance which adsorbs moisture by physical adsorption, such as zeolite or silica gel, may be used as the drying agent. The drying agent is preferably provided in the sealed region, in which case impurities such as moisture can be reduced and the reliability of the light-emitting element 220 can be increased.

The foregoing has described the display device 200.

Structural Example 2

In this structural example, a display device having a bottom emission structure will be described. Note that description of the portions described in Structural example 1 is omitted or is simply given.

Figure 12:
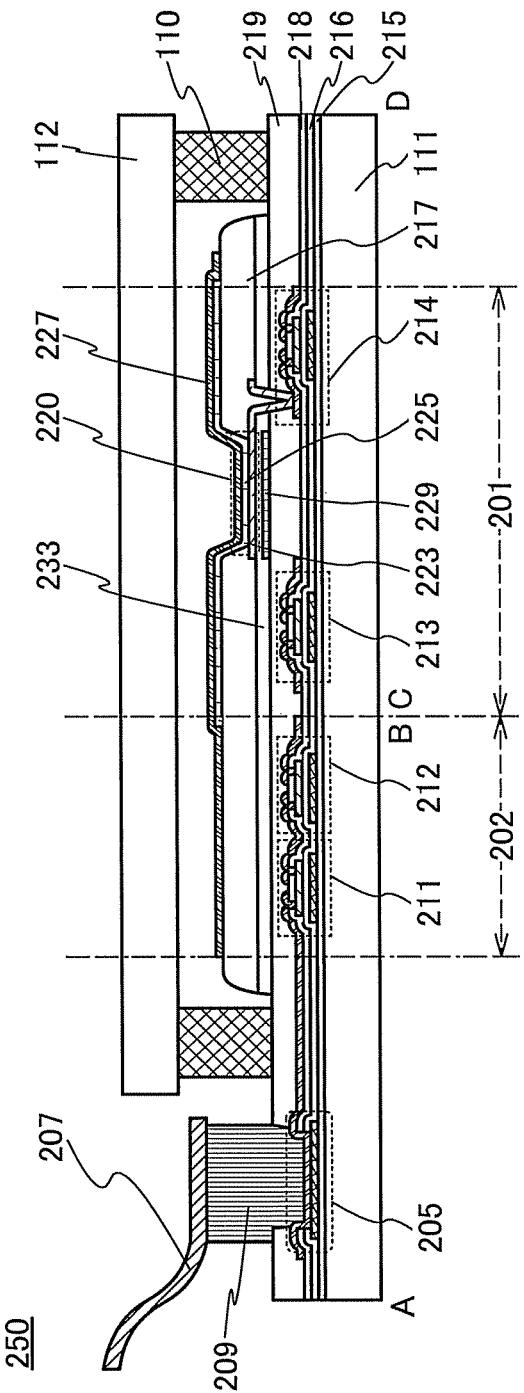
FIG. 12 illustrates a display device in accordance with one embodiment of the present invention.

FIG. 12 is a schematic cross-sectional view of a display device 250 described in this structural example.

The display device 250 is different from the display device 200 described in Structural example 1 in the following points: the display device 250 has a bottom emission structure; and a color filter 229 is provided closer to the first substrate 111 than the light-emitting element 220 is.

In the light-emitting element 220, the reflective material is used as the common electrode 227 and the light-transmitting material is used as the pixel electrode 223. Thus, light emission from the EL layer 225 is emitted to the first substrate 111 side.

Further, the color filter 229 is provided over the insulating layer 219 covering transistors to overlap with the light-emitting element 220. Moreover, the overcoat 233 is formed to cover the color filter 229. The pixel electrode 223 is formed over the overcoat 233. Here, the overcoat 233 is preferably formed using an organic insulating film such as an organic resin, in which case the overcoat 233 also functions as a planarization layer.

The foregoing has described the display device 250.

The method for manufacturing a sealed structure in an embodiment of the present invention is applied to the display devices described in this embodiment, whereby an extremely highly reliable display device in which few cracks are generated can be obtained.

This embodiment can be combined with any of the other embodiments disclosed in this specification as appropriate.

Embodiment 4

In this embodiment, as an example of a light-emitting device to which the sealed structure and the method for manufacturing the sealed structure which are described in the above embodiments can be applied, a lighting device to which an organic EL element is applied will be described with reference to FIGS. 13A and 13B. Note that description of the same portions as the above embodiments is omitted or is simplified.

Figure 13A:
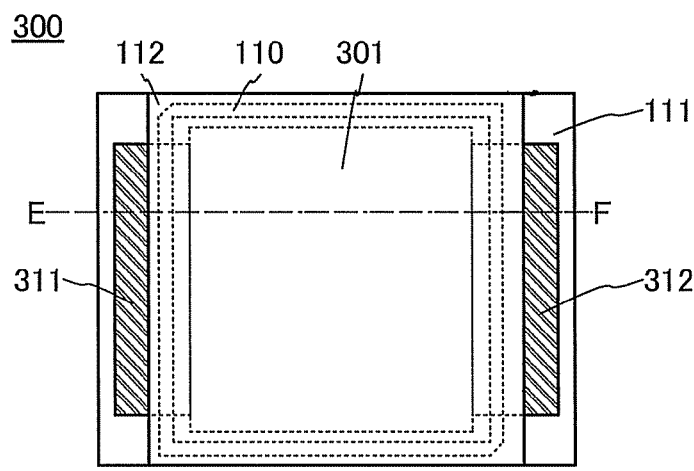
FIGS. 13A and 13B illustrate a lighting device in accordance with one embodiment of the present invention.

FIG. 13A is a schematic top view of a lighting device 300 described in this embodiment.

In the lighting device 300, a light-emitting portion 301 is included in the sealed region surrounded by the first substrate 111, the second substrate 112, and the glass layer 110. In addition, an extraction electrode 311 and an extraction electrode 312 which are electrically connected to the light-emitting portion 301 and supply power which causes the light-emitting portion 301 to emit light are provided to extend from the sealed region.

Figure 13B:
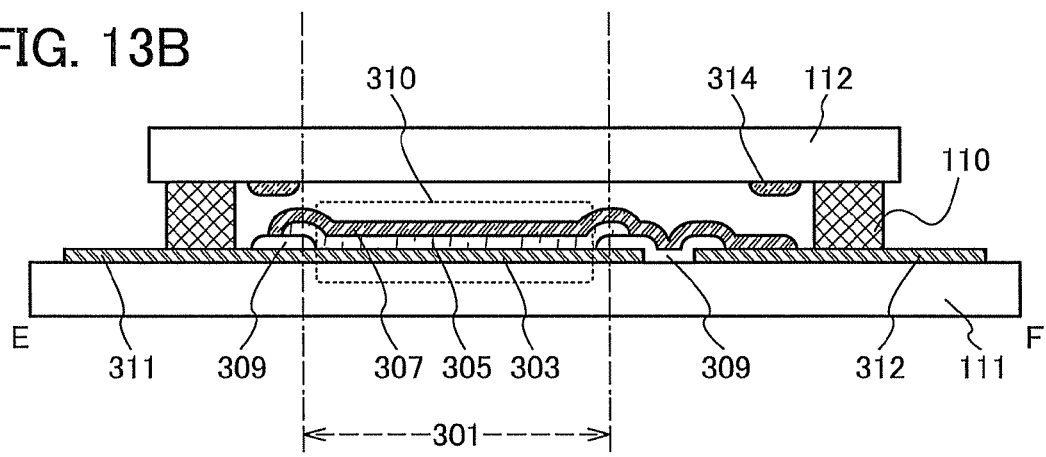

FIG. 13B is a schematic cross-sectional view along line E-F of FIG. 13A, which passes through a region including the light-emitting portion 301, the extraction electrode 311, and the extraction electrode 312.

In the sealed region, a light-emitting element 310 including an electrode 303, an EL layer 305, and an electrode 307 is provided over the first substrate 111.

The first substrate 111 and the second substrate 112 are bonded to each other at the outer edge portion of the second substrate 112 by using the glass layer 110. The glass layer 110 can have the structure described in the above embodiments.

The electrode 303 is electrically connected to the extraction electrode 311. Further, the electrode 307 is electrically connected to the extraction electrode 312. Here, FIG. 13B shows an example in which the electrode 303 and the extraction electrodes 311 and 312 are formed using the same layer on the same plane and part of the electrode 303 forms the extraction electrode 311.

An insulating layer 309 is provided to cover each of the ends of the electrode 303 and the extraction electrode 312. Further, the insulating layer 309 is provided in part of the region over the electrode 303 so that the electrode 303 and the electrode 307 do not contact and conduct. The insulating layer 309 can be formed in a manner similar to that of the insulating layer 217 shown in Embodiment 3.

The electrode 307 is formed so as to extend beyond the insulating layer 309 which covers each of the ends of the electrode 303 and the extraction electrode 312, and electrically connected to the extraction electrode 312.

Here, the lighting device 300 can have any of a bottom emission structure, a top emission structure, and a dual emission structure. A conductive material of the electrodes 303 and 307 can be selected from the above materials as appropriate in accordance with the emission structure.

Further, an auxiliary electrode formed using a low-resistance conductive material may be provided in order to increase the conductivity of the electrodes 303 or 307. In particular, in the case of the lighting device 300 including a large-area light-emitting portion 301, a potential drop due to the resistance of the electrode may cause in-plane distribution of emission luminance; therefore, it is effective to provide the auxiliary electrode.

For example, the auxiliary electrode is provided in contact with an upper surface or a bottom surface of the electrode 303. Alternatively, the auxiliary electrode which is electrically connected to the electrode 307 through an insulating layer is provided over the electrode 303. In the case where the auxiliary electrode which is in contact with the electrode 303 is provided, a step due to the auxiliary electrode is preferably covered with the insulating layer 309.

Further, as illustrated in FIG. 13B, a dry agent 314 is preferably provided in the sealed region. In the case of the top emission structure or the dual emission structure, the dry agent 314 is provided in a region which is not overlapped with the light-emitting element 310.

In addition, an insulating layer which suppresses diffusion of impurities from the substrate may be formed on the surface on the light-emitting element 310 side of one of or both the first substrate 111 and the second substrate 112.

Note that an inorganic insulating film which covers the light-emitting element 310 and does not transmit impurities such as water or oxygen may be provided. Moreover, the sealed region may be filled with an inert gas, a solid, or a viscous material, or may be in a reduced pressure atmosphere.

The method for manufacturing a sealed structure in an embodiment of the present invention is applied to the lighting device described in this embodiment, whereby an extremely highly reliable lighting device in which few cracks are generated can be obtained.

This embodiment can be combined with any of the other embodiments disclosed in this specification as appropriate.

Embodiment 5

In this embodiment, an example of the EL layer that can be applied to an embodiment of the present invention will be described with reference to FIGS. 14A to 14C.

Figure 14A:
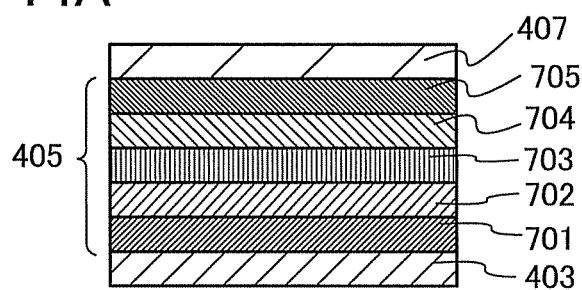
FIGS. 14A to 14C each illustrate a light-emitting element in accordance with one embodiment of the present invention.

An EL layer 405 illustrated in FIG. 14A is provided between a first electrode 403 and a second electrode 407. The first electrode 403 and the second electrode 407 can be formed in a manner similar to that of the pixel electrode or the common electrode shown in Embodiment 3, or the electrodes shown in Embodiment 4.

A light-emitting element including the EL layer 405, which is described in this embodiment, can be applied to the light-emitting device shown in the above embodiments.

The EL layer 405 needs to include at least a light-emitting layer containing a light-emitting organic compound. The EL layer 405 may have a layered structure of a layer containing a substance with a high electron-transport property, a layer containing a substance with a high hole-transport property, a layer containing a substance with a high electron-injection property, a layer containing a substance with a high hole-injection property, a layer containing a bipolar substance (a substance with a high electron-transport property and a high hole-transport property), and the like in appropriate combination. In the EL layer 405 of this embodiment, a hole-injection layer 701, a hole-transport layer 702, a layer 703 containing a light-emitting organic compound, an electron-transport layer 704, and an electron-injection layer 705 are stacked in this order over the first electrode 403. Note that the stacking order of these layers may be reversed.

Description will be made on a method for manufacturing the light-emitting element illustrated in FIG. 14A.

The hole-injection layer 701 is a layer containing a substance with a high hole-injection property. As the substance with a high hole-injection property, for example, the following metal oxides can be used: molybdenum oxide, titanium oxide, vanadium oxide, rhenium oxide, ruthenium oxide, chromium oxide, zirconium oxide, hafnium oxide, tantalum oxide, silver oxide, tungsten oxide, or manganese oxide. A phthalocyanine-based compound such as phthalocyanine (abbreviation: $H_2Pc$), or copper(II) phthalocyanine (abbreviation: CuPc) can also be used.

Alternatively, aromatic amine compounds which are low molecular organic compounds, and the like can be used.

Further alternatively, high molecular compounds (e.g., oligomers, dendrimers, or polymers) can be used. A high molecular compound to which acid is added can also be used.

In particular, the hole-injection layer 701 is preferably made of a composite material in which an acceptor substance is mixed with an organic compound with a high hole-transport property. The use of the composite material in which an acceptor substance is mixed with a substance with a high hole-transport property, allows efficient hole injection from the first electrode 403, and reduction in driving voltage of the light-emitting element. Such a composite material can be formed by co-evaporation of a substance with a high hole-transport property and an acceptor substance (an electron acceptor). By using the composite material for the hole-injection layer 701, holes can be easily injected from the first electrode 403 to the EL layer 405.

As the organic compound used for the composite material, various compounds such as an aromatic amine compound, carbazole derivatives, aromatic hydrocarbon, and a high molecular compound (such as oligomer, dendrimer, or polymer) can be used. The organic compound used for the composite material is preferably an organic compound with a high hole-transport property. Specifically, a substance having a hole mobility of $10^{-6}$ cm$^2$/Vs or higher is preferably used. Note that other substances may also be used as long as their hole-transport property is higher than their electron-transport property.

As the organic compound used for the composite material, an aromatic amine compound, a carbazole derivative, an aromatic hydrocarbon compound with a high hole mobility can be used.

Examples of the acceptor substance include an organic compound and a transition metal oxide. Oxides of metals belonging to Groups 4 to 8 in the periodic table can also be used. Specifically, it is preferable to use vanadium oxide, niobium oxide, tantalum oxide, chromium oxide, molybdenum oxide, tungsten oxide, manganese oxide, or rhenium oxide because of their high electron-accepting property. Among these, molybdenum oxide is especially preferable since it is stable in the air and has a low hygroscopic property to be easily treated.

A composite material may be formed of a high molecular compound and the aforementioned electron acceptor and used for the hole-injection layer 701.

The hole-transport layer 702 is a layer which contains a substance with a high hole-transport property. As the substance with a high hole-transport property, for example, it is possible to use an aromatic amine compound, which is mainly a substance having a hole mobility of $10^{-6}$ cm$^2$Ns or higher. Other substances may also be used as long as their hole-transport property is higher than their electron-transport property. Note that the layer which contains a substance with a high hole-transport property is not limited to a single layer, and two or more layers containing the aforementioned substances may be stacked.

A carbazole derivative, an anthracene derivative, or a high molecular compound with a high hole-transport property may also be used for the hole-transport layer 702.

For the layer 703 containing a light-emitting organic compound, a fluorescent compound which exhibits fluorescence or a phosphorescent compound which exhibits phosphorescence can be used.

Note that the layer 703 containing a light-emitting organic compound may have a structure in which a light-emitting organic compound (guest material) is dispersed in another substance (host material). Various kinds of materials can be used as the host material, and it is preferable to use a substance which has a lowest unoccupied molecular orbital level (LUMO level) higher than that of the light-emitting substance and has a highest occupied molecular orbital level (HOMO level) lower than that of the light-emitting substance.

Alternatively, plural kinds of materials can be used as the host material. For example, a substance preventing crystallization may be added in order to prevent crystallization. A different kind of substance may be further added in order to efficiently transfer energy to the guest material.

The structure in which a guest material is dispersed in a host material, prevents crystallization of the layer 703 containing a light-emitting organic compound. Further, concentration quenching due to high concentration of the guest material can also be prevented.

For the layer 703 containing a light-emitting organic compound, a high molecular compound can also be used.

When a plurality of layers each containing a light-emitting organic compound are provided and the emission colors of the layers are made different, light emission of a desired color can be obtained from the light-emitting element as a whole. For example, in a light-emitting element including two layers each containing a light-emitting organic compound, the emission color of a first layer containing a light-emitting organic compound and the emission color of a second layer containing a light-emitting organic compound are made complementary, so that the light-emitting element as a whole can emit white light. Note that "complementary colors" refer to colors that can produce an achromatic color when mixed. That is, a mixture of light emitted from substances that emit light of complementary colors produces white light. This can be applied to a light-emitting element including three or more layers each containing a light-emitting organic compound.

The electron-transport layer 704 is a layer containing a substance with a high electron-transport property. The substance with a high electron-transport property is mainly one that has an electron mobility of $10^{-6}$ cm$^2$/Vs or higher. The electron-transport layer 704 is not limited to a single layer and may be a stack of two or more layers made of such a substance.

The electron-injection layer 705 is a layer containing a substance with a high electron-injection property. For the electron-injection layer 705, an alkali metal, an alkaline earth metal, or a compound thereof (e.g., lithium, cesium, calcium, lithium fluoride, cesium fluoride, calcium fluoride, or lithium oxide) can be used. A rare earth metal compound such as erbium fluoride can also be used. It is also possible to use the aforementioned substance for forming the electron-transport layer 704.

Note that the hole-injection layer 701, the hole-transport layer 702, the layer 703 containing a light-emitting organic compound, the electron-transport layer 704, and the electron-injection layer 705, which are described above, can each be formed by an evaporation method (e.g., a vacuum evaporation method), an ink-jet method, a coating method, or the like.

Figure 14B:
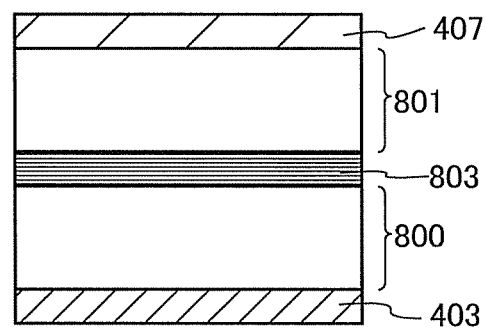

As illustrated in FIG. 14B, a plurality of EL layers may be stacked between the first electrode 403 and the second electrode 407. In that case, a charge generation layer 803 is preferably provided between a first EL layer 800 and a second EL layer 801 which are stacked. The charge generation layer 803 can be formed by using the above-mentioned composite material. Alternatively, the charge generation layer 803 may have a layered structure of a layer containing the composite material and a layer containing another material. In that case, as the layer including another material, a layer including a substance with an electron-donating property (donor substance) and a substance with a high electron-transport property, a layer formed using a transparent conductive film, or the like can be used. A light-emitting element having such a structure is unlikely to suffer the problem of energy transfer, quenching, or the like and gives wider choice of materials, thereby easily having both high light emission efficiency and a long lifetime. Moreover, it is easy to obtain a light-emitting element producing phosphorescence from one EL layer and fluorescence from the other EL layer. This structure can be combined with the above-mentioned structure of the EL layer.

When the emission colors of EL layers are made different, a light-emitting element as a whole can provide light emission of a desired color. For example, when a light-emitting element including two EL layers is formed so that the emission color of the first EL layer and the emission color of the second EL layer are complementary colors, the light-emitting element as a whole can emit white light. Note that "complementary colors" refer to colors that can produce an achromatic color when mixed. This can be applied to a light-emitting element including three or more EL layers.

In order to obtain white light with high color rendering properties, the emission spectrum needs to cover the whole visible light range and thus a light-emitting element preferably includes three or more EL layers stacked. For example, such a light-emitting element can be formed by stacking EL layers emitting light of the respective colors of red, blue, and green. In this manner, the color rendering properties of a light-emitting element can be improved by stacking EL layers of different three or more colors.

An optical adjustment layer may be formed between the first electrode 403 and the second electrode 407. The optical adjustment layer adjusts the optical distance between a reflective electrode and a light-transmitting electrode. With the optical adjustment layer, light with wavelengths in a specific range can be enhanced so that the color tone can be adjusted.

Figure 14C:
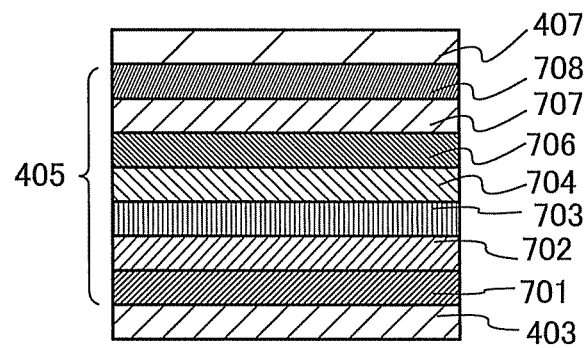

As illustrated in FIG. 14C, the EL layer 405 may include, between the first electrode 403 and the second electrode 407, the hole-injection layer 701, the hole-transport layer 702, the layer 703 containing a light-emitting organic compound, the electron-transport layer 704, an electron-injection buffer layer 706, an electron-relay layer 707, and a composite material layer 708 that is in contact with the second electrode 407.

The composite material layer 708 which is in contact with the second electrode 407 is preferably provided, because it allows reducing damage caused to the EL layer 405 particularly when the second electrode 407 is formed by sputtering. The composite material layer 708 can be formed using the above-described composite material in which an acceptor substance is mixed with an organic compound with a high hole-transport property.

Further, by providing the electron-injection buffer layer 706, an injection barrier between the composite material layer 708 and the electron-transport layer 704 can be reduced; thus, electrons generated in the composite material layer 708 can be easily injected to the electron-transport layer 704.

The electron-injection buffer layer 706 can be made of a substance with a high electron-injection property, for example, an alkali metal, an alkaline earth metal, a rare earth metal, or a compound of such a metal (e.g., an alkali metal compound (including oxide such as lithium oxide, halide, or carbonate such as lithium carbonate or cesium carbonate), an alkaline earth metal compound (including oxide, halide, or carbonate), or a rare earth metal compound (including oxide, halide, or carbonate)).

When the electron-injection buffer layer 706 contains a substance with a high electron-transport property and a donor substance, the donor substance is preferably added so that the mass ratio of the donor substance to the substance with a high electron-transport property is 0.001:1 to 0.1:1. As the donor substance, any of the following can be used, for example: an organic compound such as tetrathianaphthacene (abbreviation: TTN), nickelocene, and decamethylnickelocene, as well as an alkali metal, an alkaline earth metal, a rare earth metal, and a compound of such a metal (e.g., an alkali metal compound (including oxide such as lithium oxide, halide, and carbonate such as lithium carbonate and cesium carbonate), an alkaline earth metal compound (including oxide, halide, and carbonate), and a rare earth metal compound (including oxide, halide, and carbonate)). Note that as the substance with a high electron-transport property, the material for the electron-transport layer 704 described above can be used.

Furthermore, the electron-relay layer 707 is preferably formed between the electron-injection buffer layer 706 and the composite material layer 708. The electron-relay layer 707 is not necessarily provided; by providing the electron-relay layer 707 with a high electron-transport property, electrons can be rapidly transported to the electron-injection buffer layer 706.

In the structure in which the electron-relay layer 707 is sandwiched between the composite material layer 708 and the electron-injection buffer layer 706, the acceptor substance contained in the composite material layer 708 and the donor substance contained in the electron-injection buffer layer 706 are less likely to interact with each other, and thus their functions hardly interfere with each other. Accordingly, an increase in drive voltage can be prevented.

The electron-relay layer 707 contains a substance with a high electron-transport property and is formed so that the LUMO level of the substance with a high electron-transport property is located between the LUMO level of the acceptor substance contained in the composite material layer 708 and the LUMO level of the substance with a high electron-transport property contained in the electron-transport layer 704. In the case where the electron-relay layer 707 contains a donor substance, the donor level of the donor substance is controlled to be located between the LUMO level of the acceptor substance in the composite material layer 708 and the LUMO level of the substance with a high electron-transport property contained in the electron-transport layer 704. As a specific value of the energy level, the LUMO level of the substance with a high electron-transport property contained in the electron-relay layer 707 is preferably −5.0 eV or more, more preferably −5.0 eV to −3.0 eV.

As the substance with a high electron-transport property contained in the electron-relay layer 707, a phthalocyanine-based material or a metal complex having a metal-oxygen bond and an aromatic ligand is preferably used.

As the metal complex having a metal-oxygen bond and an aromatic ligand, which is contained in the electron-relay layer 707, a metal complex having a metal-oxygen double bond is preferably used. Since the metal-oxygen double bond has an acceptor property (a property of easily accepting electrons), electrons can be transferred (donated and accepted) more easily. Further, the metal complex having a metal-oxygen double bond is considered stable. Thus, the use of the metal complex having the metal-oxygen double bond makes it possible to drive the light-emitting element more stably at low voltage.

As a metal complex having a metal-oxygen bond and an aromatic ligand, a phthalocyanine-based material is preferable. A substance in which a metal-oxygen double bond is more likely to act on another molecular in terms of a molecular structure is particularly preferable because it has a high acceptor property.

Note that as the phthalocyanine-based material described above, a phthalocyanine-based material having a phenoxy group is preferably used. Specifically, a phthalocyanine derivative having a phenoxy group, such as PhO-VOPc, is preferable. The phthalocyanine derivative having a phenoxy group is soluble in a solvent. For that reason, such a phthalocyanine derivative has an advantage of being easily handled during formation of a light-emitting element. Owing to the solubility in a solvent, such a phthalocyanine derivative also has an advantage of facilitating maintenance of an apparatus used for film formation.

The electron-relay layer 707 may further contain a donor substance. As the donor substance, any of the following can be used, for example: an organic compound such as tetrathianaphthacene (abbreviation: TTN), nickelocene, or decamethylnickelocene, as well as an alkali metal, an alkaline earth metal, a rare earth metal, and a compound of such a metal (e.g., an alkali metal compound (including oxide such as lithium oxide, halide, and carbonate such as lithium carbonate or cesium carbonate), an alkaline earth metal compound (including oxide, halide, and carbonate), and a rare earth metal compound (including oxide, halide, and carbonate)). When such a donor substance is contained in the electron-relay layer 707, electrons can be easily transferred and the light-emitting element can be driven at lower voltage.

In the case where a donor substance is contained in the electron-relay layer 707, other than the materials described above as examples of the substance with a high electron-transport property, a substance having a LUMO level higher than the acceptor level of the acceptor substance contained in the composite material layer 708 can be used. Specifically, the LUMO level of the substance is preferably −5.0 eV or more, more preferably −5.0 eV to −3.0 eV. Examples of such a substance are a perylene derivative and a nitrogen-containing condensed aromatic compound. Note that a nitrogen-containing condensed aromatic compound is preferably used for the electron-relay layer 707 because of its stability.

Note that in the case where a donor substance is contained in the electron-relay layer 707, the electron-relay layer 707 may be formed by a method such as co-evaporation of the substance with a high electron-transport property and the donor substance.

The hole-injection layer 701, the hole-transport layer 702, the layer 703 containing a light-emitting organic compound, and the electron-transport layer 704 may each be formed using any of the above materials.

In such a manner, the EL layer 405 in this embodiment can be formed.

This embodiment can be combined with any of the other embodiments disclosed in this specification as appropriate.

Embodiment 6

In this embodiment, examples of an electronic device or a lighting device using the light-emitting device of an embodiment of the present invention will be described with reference to FIGS. 15A to 15E and FIGS. 16A to 16C.

Examples of the electronic devices using the light-emitting device are television sets (also referred to as televisions or television receivers), monitors of computers or the like, cameras such as digital cameras and digital video cameras, digital photo frames, mobile phones (also referred to as cell phones or cellular phones), portable game consoles, personal digital assistants, audio reproducing devices, and large-sized game machines such as pachinko machines. Specific examples of these electronic devices are illustrated in FIGS. 15A to 15E.

Figure 15A:
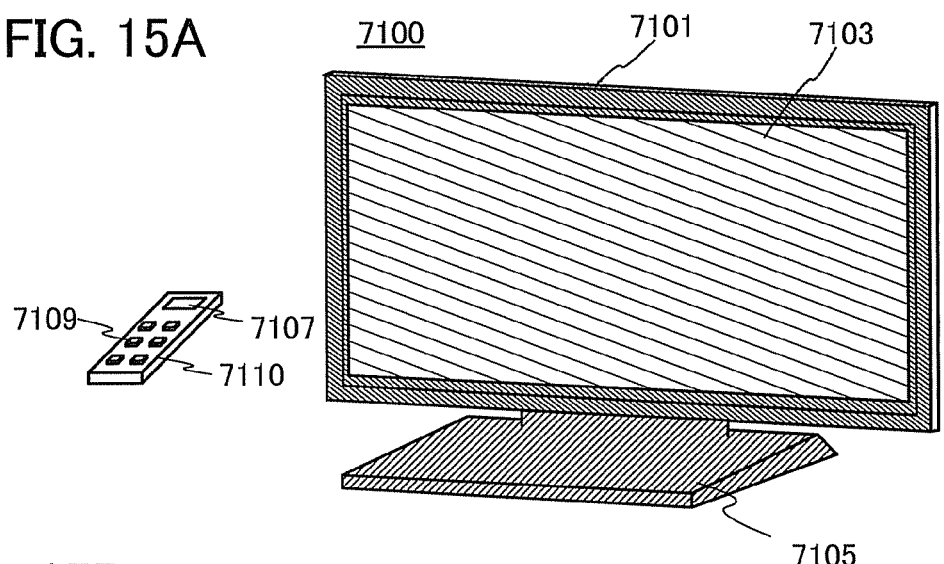
FIGS. 15A to 15E each illustrate an electronic device in accordance with one embodiment of the present invention.

FIG. 15A illustrates an example of a television set. In a television set 7100, a display portion 7103 is incorporated in a housing 7101. Images can be displayed on the display portion 7103, and the light-emitting device can be used for the display portion 7103. Here, the housing 7101 is supported by a stand 7105.

The television set 7100 can be operated by an operation switch of the housing 7101 or a separate remote controller 7110. With operation keys 7109 of the remote controller 7110, channels and volume can be controlled and images displayed on the display portion 7103 can be controlled. The remote controller 7110 may have a display portion 7107 for displaying data output from the remote controller 7110.

Note that the television set 7100 is provided with a receiver, a modem, and the like. A general television broadcast can be received with the receiver. When the television set 7100 is connected to a communication network with or without wires via the modem, one-way (from a sender to a receiver) or two-way (between a sender and a receiver or between receivers) information communication can be performed.

Figure 15B:
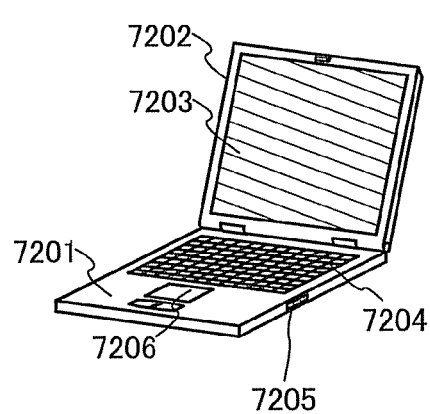

FIG. 15B illustrates a computer that includes a main body 7201, a housing 7202, a display portion 7203, a keyboard 7204, an external connection port 7205, a pointing device 7206, and the like. This computer is manufactured using the light-emitting device for the display portion 7203.

Figure 15C:
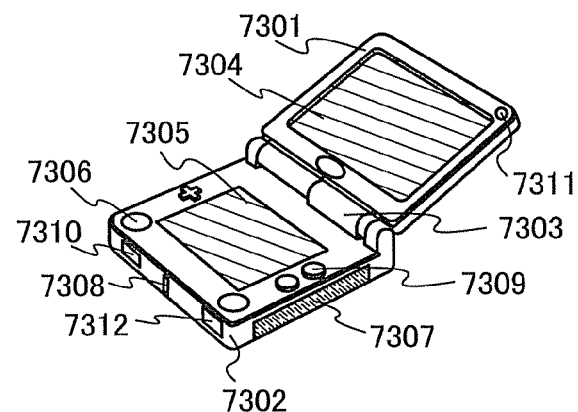

FIG. 15C illustrates a portable game console that includes two housings, a housing 7301 and a housing 7302, which are connected with a joint portion 7303 so that the portable game console can be opened or folded. A display portion 7304 is incorporated in the housing 7301, and a display portion 7305 is incorporated in the housing 7302. The portable game console in FIG. 15C also includes a speaker portion 7306, a recording medium insertion portion 7307, an LED lamp 7308, input means (an operation key 7309, a connection terminal 7310, a sensor 7311 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, tilt angle, vibration, smell, or infrared rays), and a microphone 7312), and the like. Needless to say, without limitation to the above structure, the portable game console can include other accessories as appropriate as long as the light-emitting device is used for at least one of the display portions 7304 and 7305. The portable game console in FIG. 15C has a function of reading a program or data stored in a recording medium to display it on the display portion, and a function of sharing information with another portable game console by wireless communication. The portable game console in FIG. 15C can have a variety of functions without limitation to the above functions.

Figure 15D:
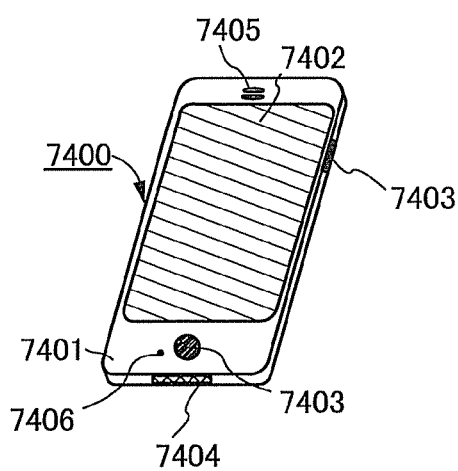

FIG. 15D illustrates an example of a mobile phone. A mobile phone 7400 includes a display portion 7402 incorporated in a housing 7401, an operation button 7403, an external connection port 7404, a speaker 7405, a microphone 7406, and the like. The mobile phone 7400 is manufactured using the light-emitting device for the display portion 7402.

When the display portion 7402 is touched with a finger or the like, data can be input into the mobile phone 7400 in FIG. 15D. Operations such as making a call and creating an e-mail can be performed by touch on the display portion 7402 with a finger or the like.

There are mainly three screen modes of the display portion 7402. The first is a display mode mainly for displaying images. The second is an input mode mainly for inputting data such as text. The third is a display-and-input mode in which two modes of the display mode and the input mode are combined.

For example, in the case of making a call or creating an e-mail, a text-input mode mainly for inputting text is selected for the display portion 7402 so that text displayed on the screen can be input. In that case, it is preferable to display a keyboard or number buttons on almost the entire screen of the display portion 7402.

When a detection device including a sensor for detecting inclination, such as a gyroscope or an acceleration sensor, is provided inside the mobile phone 7400, display on the display portion 7402 can be automatically changed by determining the orientation of the mobile phone 7400 (whether the mobile phone is placed horizontally or vertically for a landscape mode or a portrait mode).

The screen modes are switched by touching the display portion 7402 or operating the operation button 7403 of the housing 7401. The screen modes can also be switched depending on kinds of images displayed on the display portion 7402. For example, when a signal of an image displayed on the display portion is a signal of moving image data, the screen mode is switched to the display mode. In the case of a signal of text data, the screen mode is switched to the input mode.

In the input mode, when input by touching the display portion 7402 is not performed within a specified period while a signal is detected by an optical sensor in the display portion 7402, the screen mode may be controlled so as to be switched from the input mode to the display mode.

The display portion 7402 can also function as an image sensor. For example, an image of a palm print, a fingerprint, or the like is taken by touch on the display portion 7402 with the palm or the finger, whereby personal authentication can be performed. When a backlight or sensing light source that emits near-infrared light is provided in the display portion, an image of a finger vein, a palm vein, or the like can be taken.

Figure 15E:
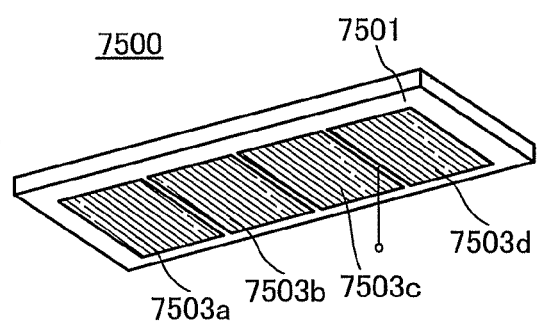

FIG. 15E illustrates an example of a lighting device. In a lighting device 7500, light-emitting devices 7503*a* to 7503*d* of an embodiment of the present invention are incorporated in a housing 7501 as light sources. The lighting device 7500 can be attached to a ceiling, a wall, or the like.

Further, a light-emitting panel which emits light having high brightness and a pale color and causing less eyestrain even in the case of long-time use, light of a bright red color, and light of a bright color different from the other colors is provided. By adjusting conditions under which light-emitting elements are driven for each emission color, a lighting device whose hue can be adjusted by a user can be achieved.

Figure 16A:
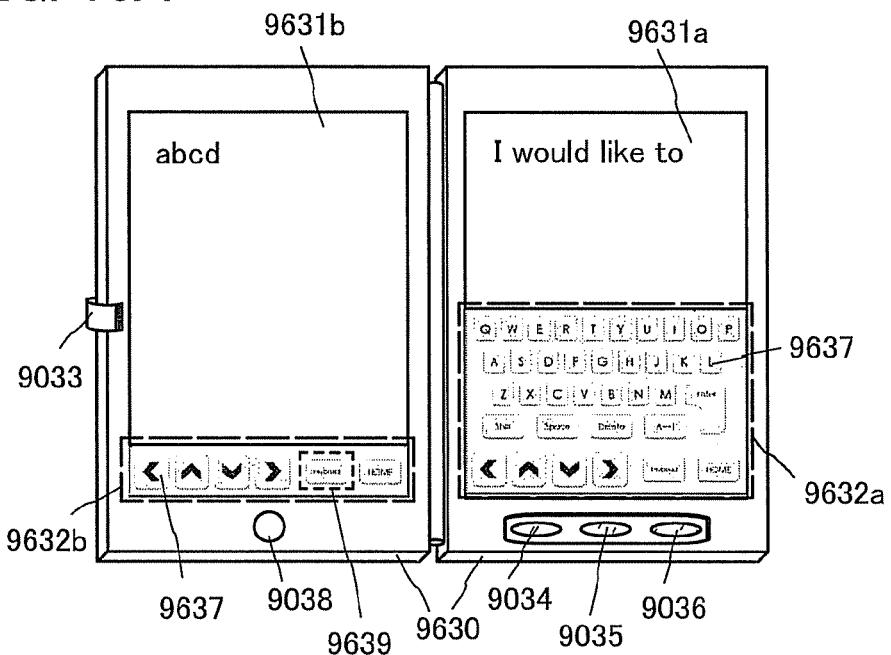
FIGS. 16A to 16C illustrate an electronic device in accordance with one embodiment of the present invention.
Figure 16B:
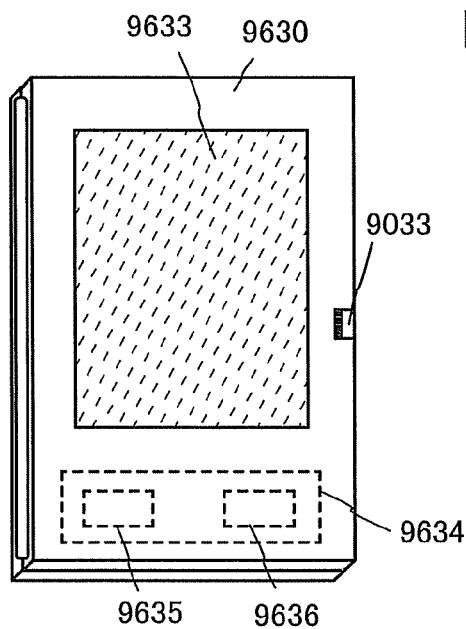

FIGS. 16A and 16B illustrate a tablet terminal that can be folded. In FIG. 16A, the tablet terminal is opened, and includes a housing 9630, a display portion 9631*a*, a display portion 9631*b*, a display-mode switching button 9034, a power button 9035, a power-saving-mode switching button 9036, a clip 9033, and an operation button 9038. The tablet terminal is manufactured using the light-emitting device for one or both of the display portion 9631*a* and the display portion 9631*b*.

A touch panel area 9632*a* can be provided in a part of the display portion 9631*a*, in which area, data can be input by touching displayed operation keys 9637. Note that half of the display portion 9631*a* has only a display function and the other half has a touch panel function. However, an embodiment of the present invention is not limited to this structure, and the whole display portion 9631*a* may have a touch panel function. For example, a keyboard can be displayed on the whole display portion 9631*a* to be used as a touch panel, and the display portion 9631*b* can be used as a display screen.

A touch panel area 9632*b* can be provided in part of the display portion 9631*b* like in the display portion 9631*a*. When a keyboard display switching button 9639 displayed on the touch panel is touched with a finger, a stylus, or the like, a keyboard can be displayed on the display portion 9631*b*.

The touch panel area 9632*a* and the touch panel area 9632*b* can be controlled by touch input at the same time.

The display-mode switching button 9034 allows switching between a landscape mode and a portrait mode, color display and black-and-white display, and the like. The power-saving-mode switching button 9036 allows optimizing the display luminance in accordance with the amount of external light in use which is detected by an optical sensor incorporated in the tablet terminal. In addition to the optical sensor, other detecting devices such as sensors for detecting inclination, like a gyroscope or an acceleration sensor, may be incorporated in the tablet terminal.

Although the display portion 9631*a* and the display portion 9631*b* have the same display area in FIG. 16A, an embodiment of the present invention is not limited to this example. The display portion 9631*a* and the display portion 9631*b* may have different areas or different display quality. For example, higher definition images may be displayed on one of the display portions 9631*a* and 9631*b*.

FIG. 16B illustrates the tablet terminal folded, which includes the housing 9630, a solar battery 9633, a charge and discharge control circuit 9634, a battery 9635, and a DCDC converter 9636. Note that FIG. 16B shows an example in which the charge and discharge control circuit 9634 includes the battery 9635 and the DCDC converter 9636.

Since the tablet terminal can be folded, the housing 9630 can be closed when not in use. Thus, the display portions 9631*a* and 9631*b* can be protected, which makes it possible to provide a tablet terminal with high durability and improved reliability for long-term use.

The tablet terminal illustrated in FIGS. 16A and 16B can have other functions such as a function of displaying various kinds of data (e.g., a still image, a moving image, and a text image), a function of displaying a calendar, a date, the time, or the like on the display portion, a touch-input function of operating or editing the data displayed on the display portion by touch input, and a function of controlling processing by various kinds of software (programs).

The solar battery 9633, which is attached on the surface of the tablet terminal, supplies electric power to a touch panel, a display portion, an image signal processor, and the like. Note that a structure in which the solar battery 9633 is provided on one or both surfaces of the housing 9630 is preferable because the battery 9635 can be charged efficiently. The use of a lithium ion battery as the battery 9635 is advantageous in downsizing or the like.

Figure 16C:
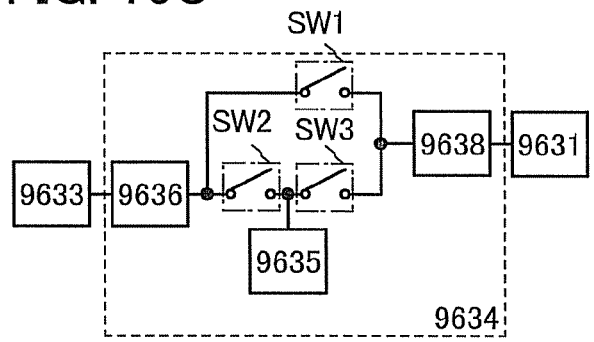
Figure 17A:
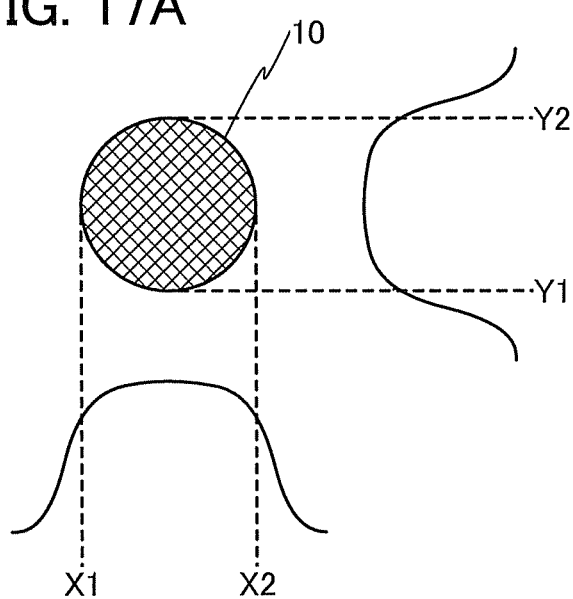
FIGS. 17A and 17B illustrate a circular laser beam in accordance with a conventional example.
Figure 17B:
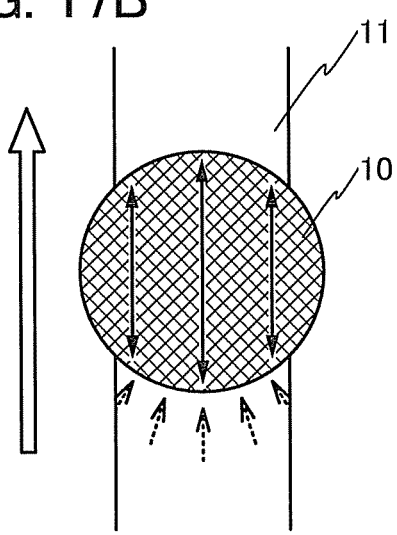

The structure and operation of the charge and discharge control circuit 9634 illustrated in FIG. 16B are described with reference to a block diagram of FIG. 16C. FIG. 16C illustrates the solar battery 9633, the battery 9635, the DCDC converter 9636, a converter 9638, switches SW1 to SW3, and the display portion 9631. The battery 9635, the DCDC converter 9636, the converter 9638, and the switches SW1 to SW3 correspond to the charge and discharge control circuit 9634 in FIG. 16B.

First, description is made on an example of the operation in the case where power is generated by the solar battery 9633 using external light. The voltage of power generated by the solar battery is raised or lowered by the DCDC converter 9636 so that a voltage for charging the battery 9635 is obtained. When the display portion 9631 is operated with the power from the solar battery 9633, the switch SW1 is turned on and the voltage of the power is raised or lowered by the converter 9638 to a voltage needed for operating the display portion 9631. When display is not performed on the display portion 9631, the switch SW1 is turned off and the switch SW2 is turned on so that the battery 9635 can be charged.

Although the solar battery 9633 is shown as an example of a charge means, there is no particular limitation on the charge means and the battery 9635 may be charged with another means such as a piezoelectric element or a thermoelectric conversion element (Peltier element). For example, the battery 9635 may be charged with a non-contact power transmission module which is capable of charging by transmitting and receiving power by wireless (without contact), or another charge means used in combination.

It is needless to say that an embodiment of the present invention is not limited to the electronic device illustrated in FIGS. 15A to 15E and FIGS. 16A to 16C as long as the light-emitting device described in the above embodiment is included.

The method for manufacturing a sealed structure in an embodiment of the present invention is applied to the light-emitting devices such as electronic devices or a lighting device described above. Therefore, an extremely highly reliable light-emitting device such as an electronic device or a lighting device in which few cracks are generated can be obtained.

This embodiment can be combined with any of the other embodiments disclosed in this specification as appropriate.

This application is based on Japanese Patent Application serial no. 2011-227026 filed with Japan Patent Office on Oct. 14, 2011, the entire contents of which are hereby incorporated by reference.

What is claimed is:

1. A method for manufacturing a sealed structure, comprising the steps of:
    placing a second substrate to face a first substrate and to be in contact with a glass layer including welded glass frits provided over the first substrate; and
    scanning and irradiating the glass layer with a laser beam to weld the glass layer to the second substrate,
    wherein an inner side of the glass layer is quadrilateral and an outer side of the glass layer is hexagonal.

2. The method for manufacturing a sealed structure, according to claim 1,
    wherein the glass layer is provided to have a closed shape.

3. The method for manufacturing a sealed structure, according to claim 1,
    wherein a light-emitting element is formed over the first substrate.

4. The method for manufacturing a sealed structure, according to claim 1, wherein, in a region where the laser beam and the glass layer overlap each other, a width of a beam spot of the laser beam in a direction of the scanning is substantially uniform.

5. The method for manufacturing a sealed structure, according to claim 1,
    wherein a beam spot shape of the laser beam has a major axis and a minor axis orthogonal to the major axis, and
    wherein the beam spot of the laser beam is tilted so that an angle between a scanning direction and the minor axis exceeds 0°.

6. A method for manufacturing a sealed structure, comprising the steps of:
    placing a second substrate to face a first substrate and to be in contact with a glass layer including welded glass fits provided over the first substrate; and
    scanning and irradiating the glass layer with a laser beam to weld the glass layer to the second substrate,
    wherein the glass layer irradiated with the laser beam includes a stripe connecting inside and outside of the glass layer, and
    wherein an inner side of the glass layer is quadrilateral and an outer side of the glass layer is hexagonal.

7. The method for manufacturing a sealed structure, according to claim 6,
    wherein the glass layer is provided to have a closed shape.

8. The method for manufacturing a sealed structure, according to claim 6,
    wherein a light-emitting element is formed over the first substrate.

9. The method for manufacturing a sealed structure, according to claim 6, wherein, in a region where the laser beam and the glass layer overlap each other, a width of a beam spot of the laser beam in a direction of the scanning is substantially uniform.

10. The method for manufacturing a sealed structure, according to claim 6,
    wherein a beam spot shape of the laser beam has a major axis and a minor axis orthogonal to the major axis, and
    wherein the beam spot of the laser beam is tilted so that an angle between a scanning direction and the minor axis exceeds 0°.

* * * * *